US012142563B2

United States Patent
Peng et al.

(10) Patent No.: US 12,142,563 B2
(45) Date of Patent: Nov. 12, 2024

(54) DUAL POWER STRUCTURE WITH EFFICIENT LAYOUT

(71) Applicant: Taiwan Semiconductor Manufacturing Company Limited, Hsinchu (TW)

(72) Inventors: Shih-Wei Peng, Hsinchu (TW); Jiann-Tyng Tzeng, Hsinchu (TW)

(73) Assignee: TAIWAN SEMICONDUCTOR MANUFACTURING COMPANY LIMITED, Hsinchu (TW)

( * ) Notice: Subject to any disclaimer, the term of this patent is extended or adjusted under 35 U.S.C. 154(b) by 770 days.

(21) Appl. No.: 16/732,202

(22) Filed: Dec. 31, 2019

(65) Prior Publication Data

US 2021/0202384 A1 Jul. 1, 2021

(51) Int. Cl.
*H01L 27/02* (2006.01)
*G06F 30/392* (2020.01)
*H01L 23/528* (2006.01)
*H01L 27/118* (2006.01)

(52) U.S. Cl.
CPC ........ *H01L 23/5286* (2013.01); *G06F 30/392* (2020.01); *H01L 27/0207* (2013.01); *H01L 27/11807* (2013.01); *H01L 2027/11861* (2013.01); *H01L 2027/11875* (2013.01); *H01L 2027/11881* (2013.01); *H01L 2027/11887* (2013.01)

(58) Field of Classification Search
CPC ............. G06F 30/392; H01L 27/11807; H01L 27/0207; H01L 23/5286; H01L 2027/11875; H01L 2027/11887; H01L 2027/11881; H01L 2027/11861; H01L 27/092

See application file for complete search history.

(56) References Cited

U.S. PATENT DOCUMENTS

| 6,940,109 | B2* | 9/2005 | Patel | H01L 27/1052 257/E27.06 |
| 2004/0000679 | A1* | 1/2004 | Patel | H01L 27/105 257/E27.06 |

OTHER PUBLICATIONS

EACH_Definition_Meaning_-_Merriam-Webster. No Date.*

* cited by examiner

*Primary Examiner* — Hrayr A Sayadian
(74) *Attorney, Agent, or Firm* — FOLEY & LARDNER LLP

(57) ABSTRACT

Disclosed herein are related to an integrated circuit having a dual power structure with an efficient layout and a method of forming the integrated circuit. In one aspect, the integrated circuit includes a substrate, a first layer facing the substrate, and a second layer facing the first layer. In one aspect, the first layer includes a set of first metal rails, where each of the set of first metal rails may be separated from its adjacent one of the set of first metal rails according to a uniform pitch along a direction. In one aspect, the second layer includes a set of second metal rails, where the set of second metal rails may include two adjacent second metal rails separated according to a first pitch along the direction and additional two adjacent second metal rails separated according to a second pitch along the direction.

20 Claims, 19 Drawing Sheets

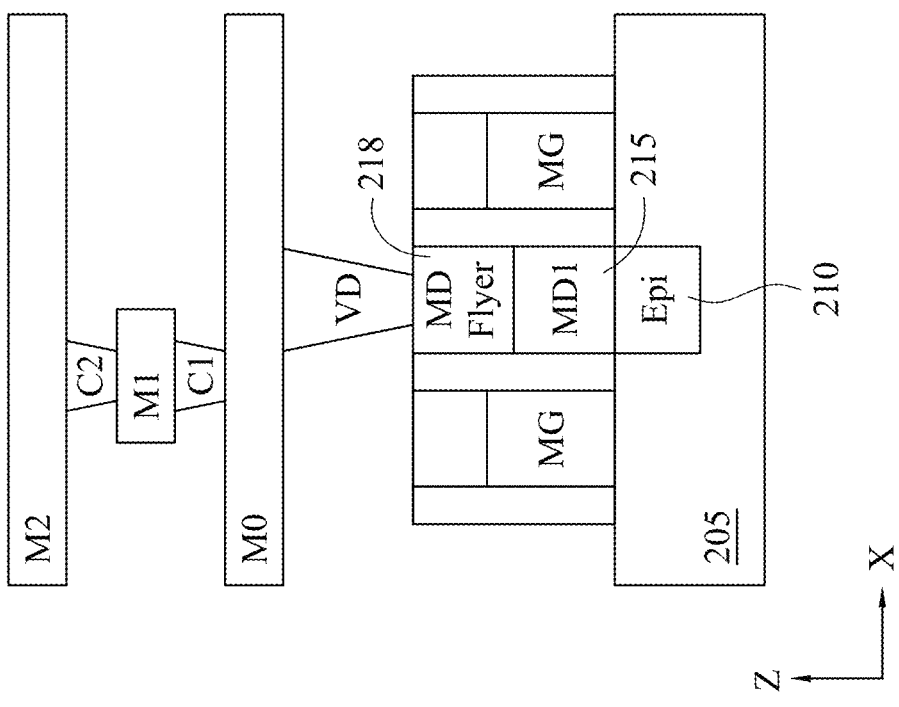

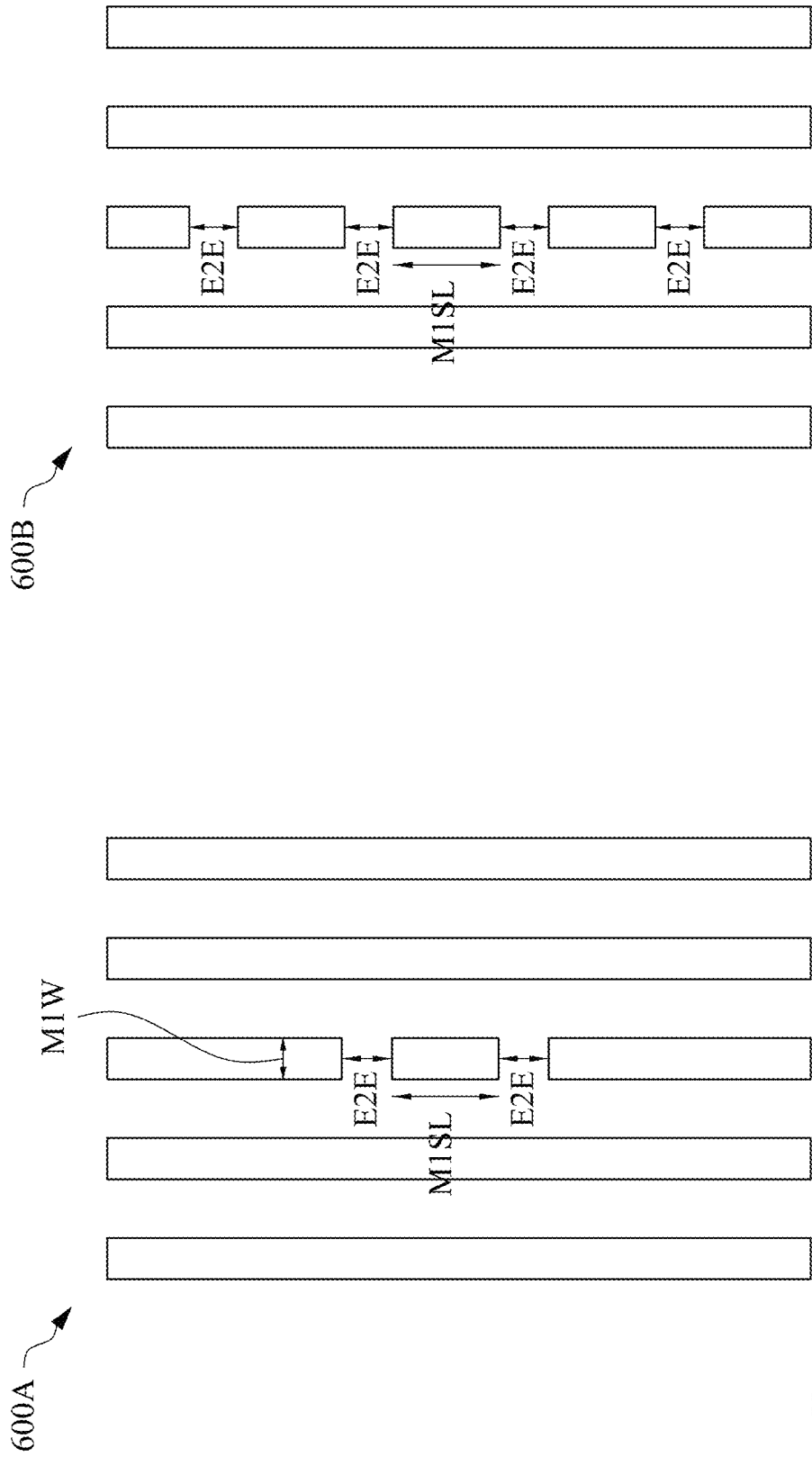

DUAL POWER STRUCTURE WITH EFFICIENT LAYOUT

BACKGROUND

The recent trend in miniaturizing integrated circuits (ICs) has resulted in smaller devices which consume less power yet provide more functionality at higher speeds. The miniaturization process has also resulted in stricter design and manufacturing specifications as well as reliability challenges. Various electronic design automation (EDA) tools generate, optimize and verify standard cell layout patterns for integrated circuits while ensuring that the standard cell layout designs and manufacturing specifications are met.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2A is a cross section diagram of an integrated circuit, in accordance with some embodiments.

FIG. 2B is a cross section diagram of an integrated circuit, in accordance with some embodiments.

FIG. 6A is a diagram of an example layout pattern of metal rails of an integrated circuit, in accordance with some embodiments.

FIG. 6B is a diagram of an example layout pattern of metal rails of an integrated circuit, in accordance with some embodiments.

DETAILED DESCRIPTION

Figure 1A:
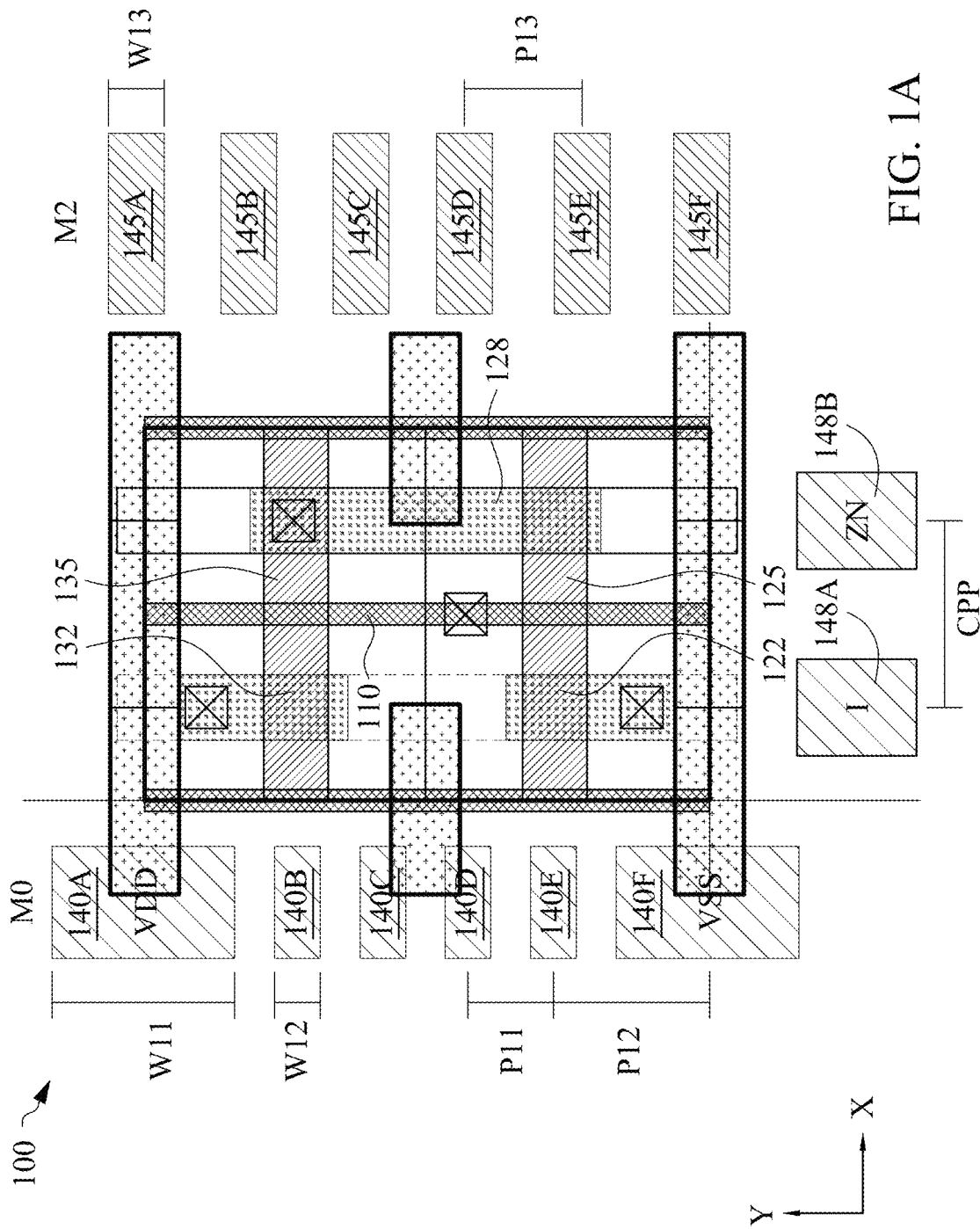
FIG. 1A is a diagram of a layout design of an integrated circuit, in accordance with one embodiment.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, an integrated circuit includes a substrate, a first layer facing the substrate and a second layer facing the first layer. The second layer may be farther away from the substrate than the first layer. In some embodiments, the first layer includes a set of first metal rails each having a uniform pitch and/or a uniform width within an area, and the second layer includes a set of second metal rails having varying pitches and/or varying widths within the area of the integrated circuit. For example, the area is allocated for a standard cell having one or more predetermined layout patterns for a commonly implemented circuit (e.g., analog circuit (e.g., amplifier), digital circuit (e.g., an inverter, a NAND gate, a NOR gate, a transmission circuit, etc.). The standard cell may be generated by a chip manufacturing company or by a circuit designer. In one aspect, multiples (or replicates) of a standard cell or different standard cells can be placed abutting with each other or partially overlapped with each other to allow easy placement and connections of commonly employed circuits. In one aspect, an area for a standard cell can be reduced by decreasing a uniform pitch and/or a uniform width of the set of first metal rails, such that a total area for placing multiples (or replicates) of the standard cell or different standard cells can be reduced. Meanwhile, a signal quality or a voltage supplied can be ensured by varying pitches and/or widths of the second metal rails.

In accordance with some embodiments, an integrated circuit includes a third layer between the first layer and the second layer. In some embodiments, the third layer includes a set of third metal rails. In one aspect, the set of first metal rails and the set of second metal rails extend in a first direction, where the set of third metal rails extend in a second direction traversing the first direction. Each of the set of third metal rails may be separated from its adjacent third metal rail according to an integer multiple of a pitch of a polysilicon (e.g., gate electrode of a transistor) in the substrate. Advantageously, the set of third metal rails extending in the second direction and separated according to the integer multiple of the pitch of the polysilicon allows ease of routing between and integration of multiples (or replicates) of the same standard cell or different standard cells.

In accordance with some embodiments, an integrated circuit is generated based on a replacement pattern. In one approach, a portion of a layout pattern for the area of the integrated circuit violating a placement rule associated with the set of first metal rails is automatically detected. An example of the placement rule includes forbidding a layout pattern for a via contact between an active region in the area and one or more predetermined metal rails of the set of first metal rails. For example, a layout pattern for a via contact between i) an active region and ii) a first metal rail adjacent to another first metal rail for supplying power (e.g., VDD or VSS) may be forbidden. In one approach, a replacement design complying with the placement rule is automatically determined, and the portion of the layout pattern is automatically replaced by the determined replacement pattern. Accordingly, a layout pattern including a set of first metal rails each having a uniform pitch and/or a uniform width within an area, and a set of second metal rails having varying pitches and/or varying widths within the area, for example, for the standard cell, can be easily placed and routed.

FIG. 1A is a diagram of an example layout design 100 of an integrated circuit, in accordance with one embodiment. In one aspect, the layout design 100 is for an inverter circuit. The layout design 100 may be a standard cell, and multiples (or replicates) of the layout design 100 can be placed and routed such that different areas of an integrated circuit can have identical or similar configurations. In FIG. 1A, the layout design 100 includes layout patterns 110, 122, 125, 128, 132, 135, 140A-140F, 145A-145F, and 148A-148B. In some embodiments, the layout design 100 includes more, fewer, or different layout patterns than shown in FIG. 1A. In some embodiments, the layout patterns of the layout design 100 are arranged in a different manner than shown in FIG. 1A. In one aspect, an integrated circuit can be fabricated or formed according to the layout design 100.

In one embodiment, the layout patterns 110 and 125 indicate a dimension and/or a location of an N-type transistor (e.g., NMOS) in a substrate. In one aspect, the layout pattern 110 extending in the Y-direction corresponds to a polysilicon to form a gate of the N-type transistor, and the layout pattern 125 extending in the X-direction corresponds to an active region in N-diffusion to form a source and a drain of the N-type transistor. In one aspect, the layout patterns 122, 128 extending in the Y-direction correspond to metal over diffusion (e.g., MD or MD flyer) to electrically supply or sink current from the N-type transistor. For example, a gate of the N-type transistor is formed, at which the layout patterns 110, 125 intersect with each other; a source of the N-type transistor is formed, at which the layout patterns 122, 125 intersect with each other; and a drain of the N-type transistor is formed, at which the layout patterns 125, 128 intersect with each other.

In one embodiment, the layout patterns 110 and 135 indicate a dimension and/or location of a P-type transistor (e.g., PMOS) in a substrate. In one aspect, the layout pattern 110 extending in the Y-direction corresponds to a polysilicon to form a gate of the P-type transistor, and the layout pattern 135 extending in the X-direction corresponds to an active region in a P-diffusion to form a source and a drain of the P-type transistor. In one aspect, the layout patterns 132, 128 extending in the Y-direction correspond to metal over diffusion (e.g., MD or MD flyer) to electrically supply or sink current from the P-type transistor. For example, a gate of the P-type transistor is formed, at which the layout patterns 110, 135 intersect with each other; a source of the P-type transistor is formed, at which the layout patterns 132, 135 intersect with each other; and a drain of the P-type transistor is formed, at which the layout patterns 135, 128 intersect with each other. In this configuration, the drain of the N-type transistor and the drain of the P-type transistor are coupled to each other and the gate of the N-type transistor and the gate of the P-type transistor are coupled to each other to form an inverter.

In one embodiment, the layout patterns 140A-140F indicate a dimension and/or a location of a set of first metal rails in a first layer over the substrate. The first layer may be a M0 layer. The layout patterns 140A-140F may extend in the X-direction within an area of the standard cell. In one aspect, metal rails formed according to one or more of the layout patterns 140A-140F can electrically connect to one or more components formed according to one or more of the layout patterns 110, 122, 128, 132. For example, a metal rail formed according to the layout pattern 140A can extend in the X-direction and connect to metal over diffusion formed according to the layout pattern 132 through a via contact to supply a supply voltage VDD to the source of the P-type transistor. Similarly, a metal rail formed according to the layout pattern 140F can extend in the X-direction and connect to metal over diffusion formed according to the layout pattern 122 through a via contact to supply a supply voltage VSS to the source of the N-type transistor. In one embodiment, each of the layout patterns 140A, 140F has a width W11 along the Y-direction, and each of the layout patterns 140B-140E has a width W12 along the Y-direction. The width W12 may be less than the width W11. The width W12 may be a minimum width allowable for a metal rail in the M0 layer. Because of the varying widths of the layout patterns 140A-140F, the layout patterns 140A-140F may have varying pitches. In one aspect, a pitch between two metal rails is a distance between a half width point of one of the two metal rails and a half width point of the other of the two metal rails. For example, the layout patterns 140D, 140E are separated along the Y-direction according to a pitch P11, and the layout patterns 140E, 140F are separated along the Y-direction according to a pitch P12 larger than the pitch P11. Due to the layout patterns 140A, 140F having a larger width W11 than the width W12 of other layout patterns 140B-140E, metal rails formed according to the layout patterns 140A, 140F can have a less resistance than metal rails formed according to the layout patterns 140B-140E.

In one embodiment, the layout patterns 148A, 148B indicate a dimension and/or a location of a set of second metal rails in a second layer over the first layer. The second layer may be a M1 layer. The layout patterns 148A, 148B may extend in the Y-direction within the area of the standard cell. In one aspect, metal rails formed according to one or more of the layout patterns 148A, 148B can electrically connect to metal rails formed according to one or more of the layout patterns 140A-140F. For example, a metal rail formed according to the layout pattern 148A can extend in the Y-direction and connect to a metal rail formed according to the layout pattern 140A extending in the X-direction through a via contact to provide the supply voltage VDD to the layout pattern 140A. In one example, the layout patterns 148A, 148B are separated along the X-direction according to an integer multiple of a contacted poly pitch (CPP). In some embodiments, each of the layout patterns 148A, 148B is located at a mid-point between two corresponding layout patterns 110 for polysilicon. In one aspect, one of the layout patterns 148A, 148B is implemented to form a metal rail or a metal stub that electrically connects between the metal rails in the M0 layer and the M2 layer, for example, to supply power (e.g., VDD or VSS). The other of the layout patterns 148A, 148B may be implemented to form a metal rail for a local interconnect.

In one embodiment, the layout patterns 145A-145F indicate a dimension and/or a location of a set of third metal rails in a third layer over the second layer. The third layer may be a M2 layer. The layout patterns 145A-145F may extend in the X-direction within the area of the standard cell. In one aspect, metal rails formed according to one or more of the layout patterns 145A-145F can electrically connect to metal rails formed according to one or more of the layout patterns 148A, 148B. For example, a metal rail formed according to the layout pattern 145A can extend in the X-direction and connect to a metal rail formed according to the layout pattern 148A extending in the Y-direction through a via contact to supply the supply voltage VDD to the metal rail formed according to the layout pattern 148A. In one embodiment, each of the layout patterns 145A-145F has a uniform width W13 along the Y-direction, and is separated from its adjacent one of the layout patterns 145A-145F according to a uniform pitch P13.

According to the layout patterns 110, 122, 125, 128, 132, 135, 140A-140F, 145A-145F, and 148A-148B as shown in FIG. 1A, two or more of the layout design 100 can be placed abutting with each other or with another layout design having a similar configuration.

Figure 1B:
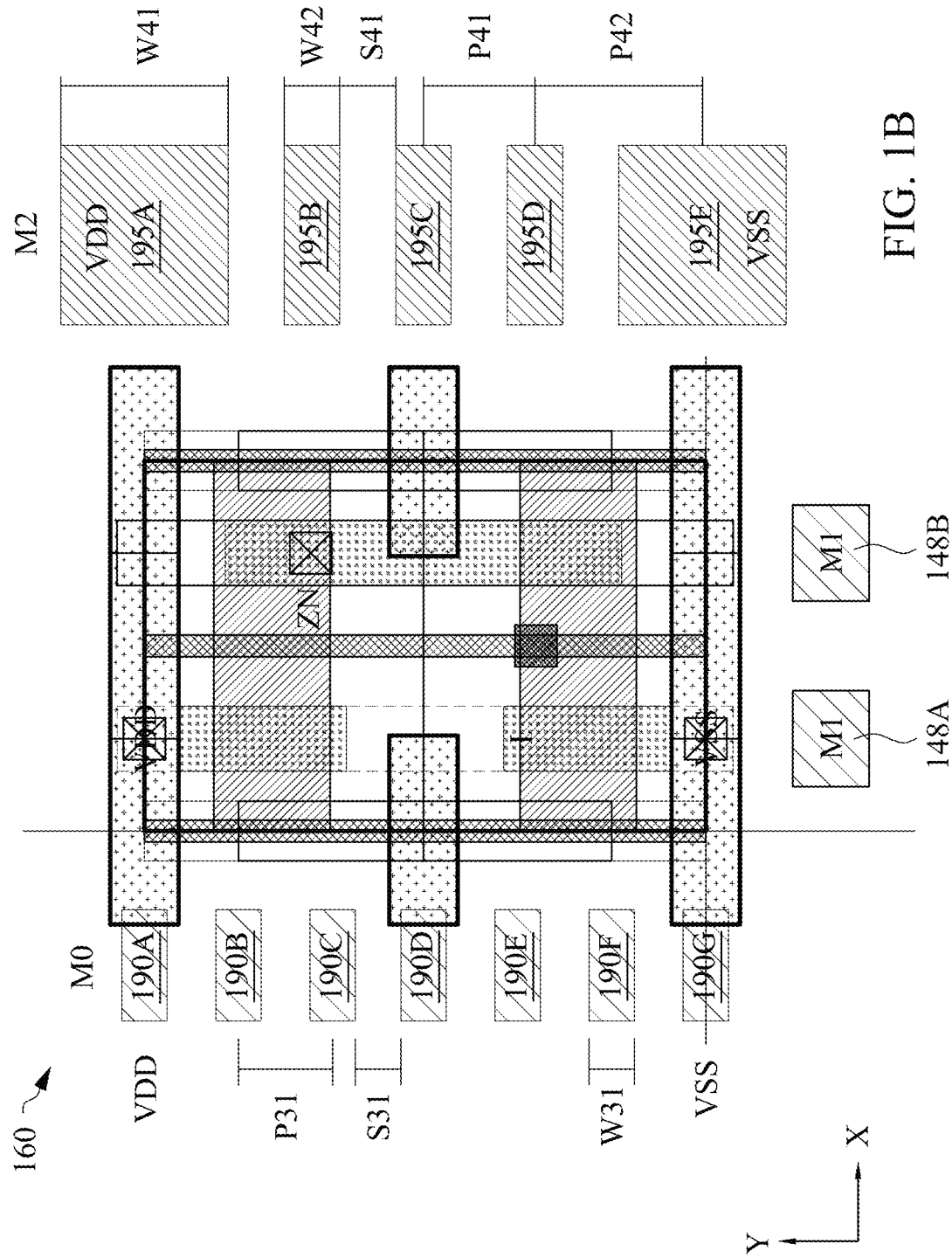
FIG. 1B is a diagram of a layout design of an integrated circuit, in accordance with some embodiments.

FIG. 1B is a diagram of a layout design 160 of an integrated circuit, in accordance with some embodiments. In one aspect, the layout design 160 is for an inverter circuit. The layout design 160 may be a standard cell, and multiples (or replicates) of the layout design 160 can be placed and routed to form an integrated circuit. The layout design 160 is similar to the layout design 100 of FIG. 1A with layout patterns for forming the N-type transistor and the P-type transistor except that layout patterns 190A-190G and 195A-195E are included instead of the layout patterns 140A-140F and 145A-145F. Hence, detailed description of duplicated portion thereof is omitted herein for the sake of brevity. In one aspect, the layout design 160 includes the layout patterns 190A-190G each having a uniform pitch and/or a uniform width for a first set of metal rails in the M0 layer and the layout patterns 195A-195E having varying pitches and/or varying widths for a second set of metal rails in the M2 layer. Advantageously, the layout design 160 can be implemented in a compact form, while preserving a signal quality or a supply voltage.

In one embodiment, the layout patterns 190A-190G indicate a dimension and/or a location of a set of first metal rails in the first layer over the substrate. The first layer may be the M0 layer. The layout patterns 190A-190G may extend in the X-direction within an area of the standard cell. In one embodiment, each of the layout patterns 190A-190G is separated from its adjacent one of the layout patterns 190A-190G by a uniform distance S31. The uniform distance S31 may be a minimum allowable separation between two metal rails in the M0 layer. In one embodiment, each of the layout patterns 190A-190G has a uniform width W31 along the Y-direction, such that each of the layout patterns 190A-190G is separated from its adjacent one of the layout patterns 190A-190G according to a uniform pitch P31.

In one embodiment, the layout patterns 195A-195E indicate a dimension and/or a location of a set of third metal rails in the third layer over the second layer. The third layer may be M2 layer. The layout patterns 195A-195E may extend in the X-direction within the area of the standard cell. In one embodiment, each of the layout patterns 195A-195E is separated from its adjacent one of the layout patterns 195A-195E by a uniform distance S41. The uniform distance S41 may be a minimum allowable separation between two metal rails in the M2 layer. In one embodiment, each of the layout patterns 195A, 195E has a width W41 along the Y-direction, and each of the layout patterns 195B-195D has a width W42 along the Y-direction. The width W42 may be less than the width W41. The width W42 may be a minimum width allowable for a metal rail in the M2 layer. Because of the varying widths of the layout patterns 195A-195E, the layout patterns 195A-195E may have varying pitches. For example, the layout patterns 195B, 195C are separated along the Y-direction according to a pitch P41, and the layout patterns 195C, 195D are separated along the Y-direction according to the pitch P41, where the layout patterns 195A, 195B are separated along the Y-direction according to a pitch P42 larger than the pitch P41 and the layout patterns 195D, 195E are separated along the Y-direction according to the pitch P42.

Advantageously, the layout design 160 can be implemented in a reduced area, without degrading operation of the integrated circuit. In some embodiments, each of the layout patterns 190A-190G has a minimum width allowed for the first metal rails in the M0 layer, and is separated from its adjacent one of the layout patterns 190A-190G by a minimum spacing allowed for the first metal rails in the M0 layer. Hence, a height of the layout design 160 along the Y-direction can be reduced or minimized, while allowing connections to layout patterns for active components (e.g., transistors). Meanwhile, in some embodiments, each of the layout patterns 195B-195D has a minimum width allowed for the third metal rails in the M2 layer, and each of layout patterns 195A, 195E has a larger width than the layout patterns 195B-195D. Each of the layout patterns 195A-195E may be separated from its adjacent one of the layout pattern 195A-195E by a minimum spacing allowed for the third metal rails in the M2 layer, such that the layout patterns 195A-195E have varying pitches. By increasing the width of the layout patterns 195A, 195E, a resistance of the metal rails formed according to the layout patterns 195A, 195E can be reduced. Thus, degradation of a quality or a voltage level of the supply voltages VDD, VSS provided to transistors formed according to the layout design 160 can be reduced or obviated.

In some embodiments, a layout pattern for a via contact (e.g., VD) between the active region and one or more predetermined metal rails is forbidden to allow the layout design 160 to have a compact form. In one approach, a metal rail of a layout pattern adjacent to a metal rail for supplying power may be forbidden from having a via contact (e.g., VD) to electrically couple to the active region. For example, a metal rail formed according to the layout pattern 190B adjacent to the layout pattern 190A may extend in the X-direction, and may be forbidden from having a via contact (e.g., VD) with the active region within the layout design 160. Similarly, for example, a metal rail formed according to the layout pattern 190F adjacent to the layout pattern 190G may extend in the X-direction, and may be forbidden from having a via contact (e.g., VD) with the active region within the layout design 160. In one aspect, a via contact (e.g., VD) between an active region of a transistor and a metal rail may cause an increase in a spacing between metal rails, thereby causing an increase in the area of the layout design 160. For example, a metal rail formed according to the layout pattern 190A for supplying power may have a via contact for contacting an active region (e.g., NTAP) underneath. To allow via contacts between a first meal layer M0 and an active region, two first metal rails in the M0 layer may have a larger spacing than a minimum spacing allowed for two first metal rails in the M0 layer. Thus, by forbidding or preventing a via contact (e.g., VD) between an active region of a transistor and one or more predetermined metal rails within the layout design 160, the layout design 160 can be formed in a compact form.

FIGS. 2A & 2B show cross section diagrams 200A, 200B of an integrated circuit, in accordance with some embodiments. In one aspect, the integrated circuit includes a substrate 205 including an epitaxial layer 210, which may correspond to an active region. On the epitaxial layer 210, a conductive layer MD 215, or a non-conductive insulator 225 may be formed. On the conductive layer MD 215 or the non-conductive insulator 225, a conductive MD flyer 218 may be formed. Hence, the epitaxial layer 210 may be electrically coupled to another layer or a device through the conductive layer MD 215 and the conductive MD flyer 218. Meanwhile, the conductive MD flyer 218 may be routed over the non-conducive insulator 225 as a jumper connection without electrically shorting with another epitaxial layer 210.

In some embodiments, the integrated circuit includes layers M0, M1, M2 for routing or connecting different components (e.g., active components) of the integrated circuit. In some embodiments, the first layer M0 is formed over the substrate 205. The first layer M0 may include the first metal rails 190A-190G of FIG. 1B. The first layer M0 may be electrically coupled to the conductive MD flyer 218 through a via contact VD. In one aspect, the first layer M0 is a first metal layer in back end of line (BEOL) that connects to a middle of line (MEOL).

In some embodiments, the integrated circuit includes a second layer M1 over the first layer M0. The second layer M1 may include the second metal rails 148A-148E of FIG. 1B. The second layer M1 may be electrically coupled to the first layer M0 through a via contact C1.

In some embodiments, the integrated circuit includes a third layer M2 over the second layer M1. The third layer M2 may include the third metal rails formed according to the layout patterns 195A-195E of FIG. 1B. The third layer M2 may be electrically coupled to the second layer M1 through a via contact C2.

In one aspect, the first layer M0 is frequently used for connecting different transistors, because the first layer M0 is closer to the active region or the MD flyer 218 than other metal layers M1, M2 or higher layers. Thus, by reducing the width and the pitch of metal rails in the first layer M0, an area of the layout design can be reduced. Meanwhile, reduction in a width of a metal rail can increase a resistance of the metal rail. By increasing a width of metal rails in the third layer M2, the resistance of the third layer M2 can be reduced. Hence, a degradation of supply voltage due to IR drop can be mitigated, by increasing or varying pitches and/or widths of the metal rails in the third layer M2, while the area of the layout design can be conserved due to the metal rails in the first layer M0 each having a uniform width and/or a uniform pitch.

In some embodiments, the integrated circuit includes additional layers or components than shown in FIGS. 2A and 2B. For example, the integrated circuit includes additional metal layers (e.g., M3-M7) than shown in FIGS. 2A and 2B.

Figure 3A:
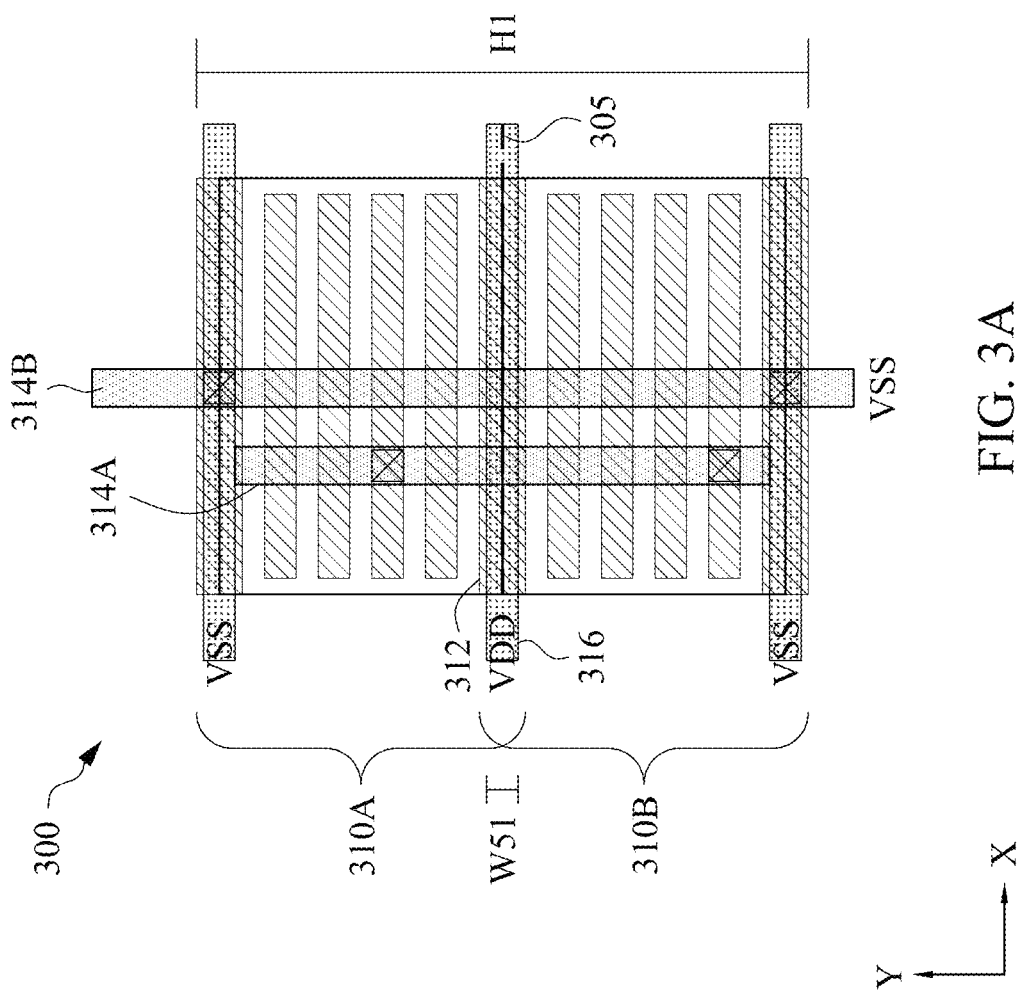
FIG. 3A is a diagram of an example layout design of two standard cells, in accordance with some embodiments.

FIG. 3A is a diagram of an example layout design 300 of two standard cells 310A, 310B partially overlapping with each other, in accordance with some embodiments. The standard cell 310A may be mirrored with respect to an axis 305 to generate the standard cell 310B. For simplicity, layout patterns for M0 metal rails, M1 metal rails, M2 metal rails are shown, but the layout design 300 may include additional layout patterns (e.g., layout patterns for additional M2 metal rails or active components). In one example, layout patterns for M0 metal rails extend in the X-direction, layout patterns for M1 metal rails extend in the Y-direction, and layout patterns for M2 metal rails extend in the X-direction. M1 metal rail formed according to the layout pattern 314A may be used for connecting or providing a control signal or a logic computation result, where M1 metal rail formed according to the layout pattern 314B may be used for providing power (e.g., VDD or VSS). In one example, the layout patterns for the M0 metal rails each have a uniform width W51 or substantially close to the width W51, and the layout patterns for the M2 metal rails each have the uniform width W51. In the layout design 300, the standard cells 310A, 310B are overlapped such that a layout pattern 312 for the M0 metal rail and a layout pattern 316 for the M2 metal rail in an area overlapped by the standard cells 310A, 310B each have the width W51 or substantially close to the width W51. In one aspect, the standard cells 310A, 310B with the layout patterns for M0 metal rail and M2 metal rail each having uniform width W51 (or substantially close to the width W51) and overlapped as shown in FIG. 3A allow two standard cells 310A, 310B to be placed in a compact form with a height H1. However, a narrow width W51 may cause an increased resistance of M0 metal rails and M2 metal rails, which may cause IR drop to degrade a signal quality or a supply voltage (e.g., VDD, VSS) provided to active regions.

Figure 3B:
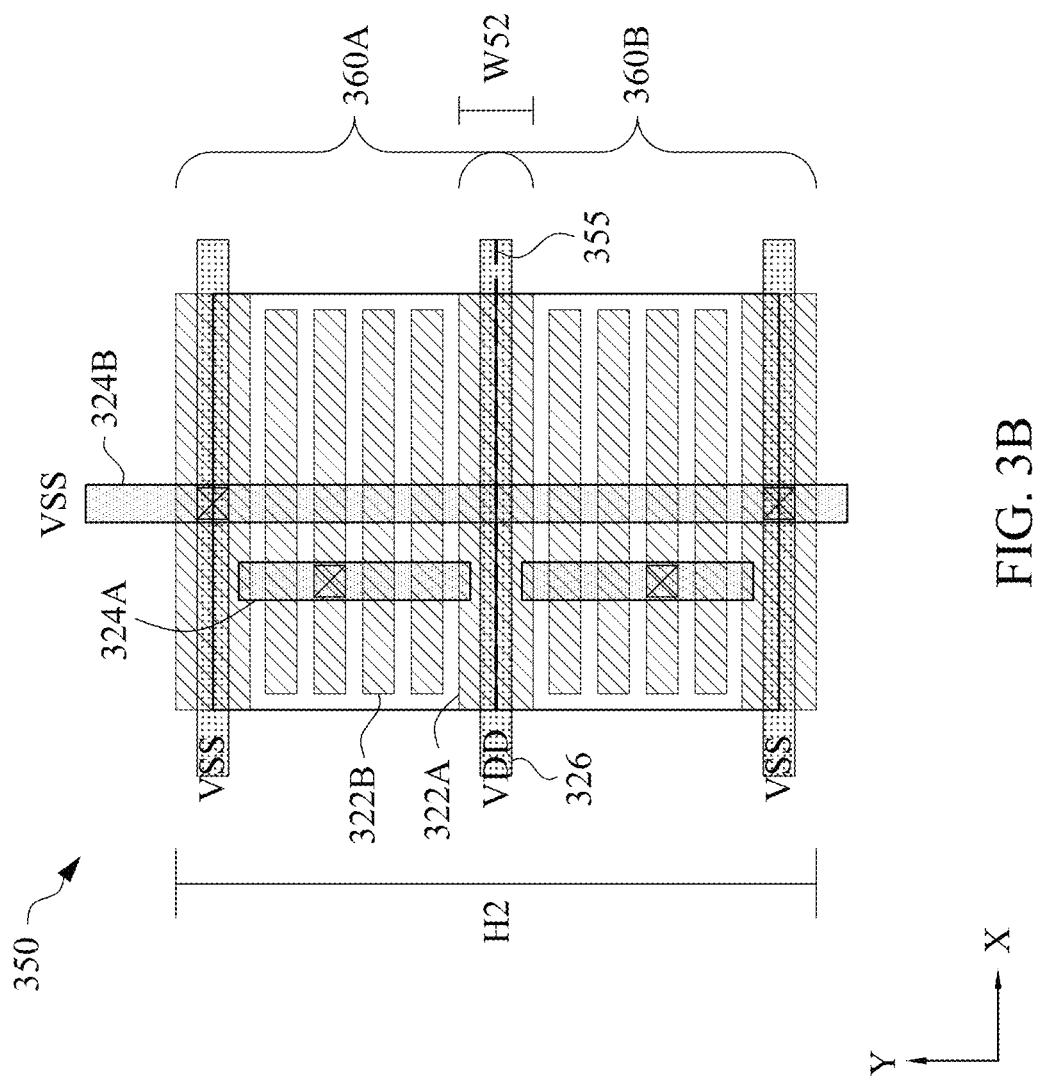
FIG. 3B is a diagram of an example layout design of two standard cells, in accordance with some embodiments.

FIG. 3B is a diagram of an example layout design 350 of two standard cells 360A, 360B, in accordance with some embodiments. The standard cell 360A may be mirrored with respect to an axis 355 to generate the standard cell 360B. In one example, layout patterns for M0 metal rails extend in the X-direction, layout patterns for M1 metal rails extend in the Y-direction, and layout patterns for M2 metal rails extend in the X-direction. M1 metal rail formed according to the layout pattern 324A may be used for connecting or providing a control signal or a logic computation result, where M1 metal rail formed according to the layout pattern 324B may be used for providing power (e.g., VDD or VSS). In one example, the standard cells 360A, 360B may be similar to the standard cells 310A, 310B in FIG. 3A, except that the layout patterns (e.g., layout patterns 322A, 322B) for the M0 metal rails have varying widths and/or varying pitches. The standard cells 360A, 360B may also include additional layout patterns (e.g., layout patterns for the M2 metal rails) not shown in FIG. 3B. In one example, layout patterns (e.g., layout pattern 322A) for the M0 metal rails disposed near top and bottom edges of the standard cells 360A, 360B each have a larger width W52 than the width (e.g., W51) of other layout patterns (e.g., layout pattern 322B) for the M0 metal rails and the width (e.g., W51) of layout patterns (e.g., layout pattern 326) for the M2 metal rails. In one aspect, the standard cells 360A, 360B with the layout patterns each having a larger width W52 of the layout patterns (e.g., layout pattern 322A) for the M0 metal rails disposed near the top and bottom edges of the standard cells 360A, 360B allow the resistance of metal rails to be reduced, such that a supply voltage (e.g., VDD, VSS) can be supplied to active components (e.g., transistors) with less degradation due to IR drop. However, a height H2 of two standard cells 360A, 360B overlapped as shown in FIG. 3B may be larger than the height H1 of the two standard cells 310A, 310B overlapped as shown in FIG. 3A, because of the larger width W52 of the layout patterns (e.g., layout pattern 322A) for the M0 metal rails.

Figure 3C:
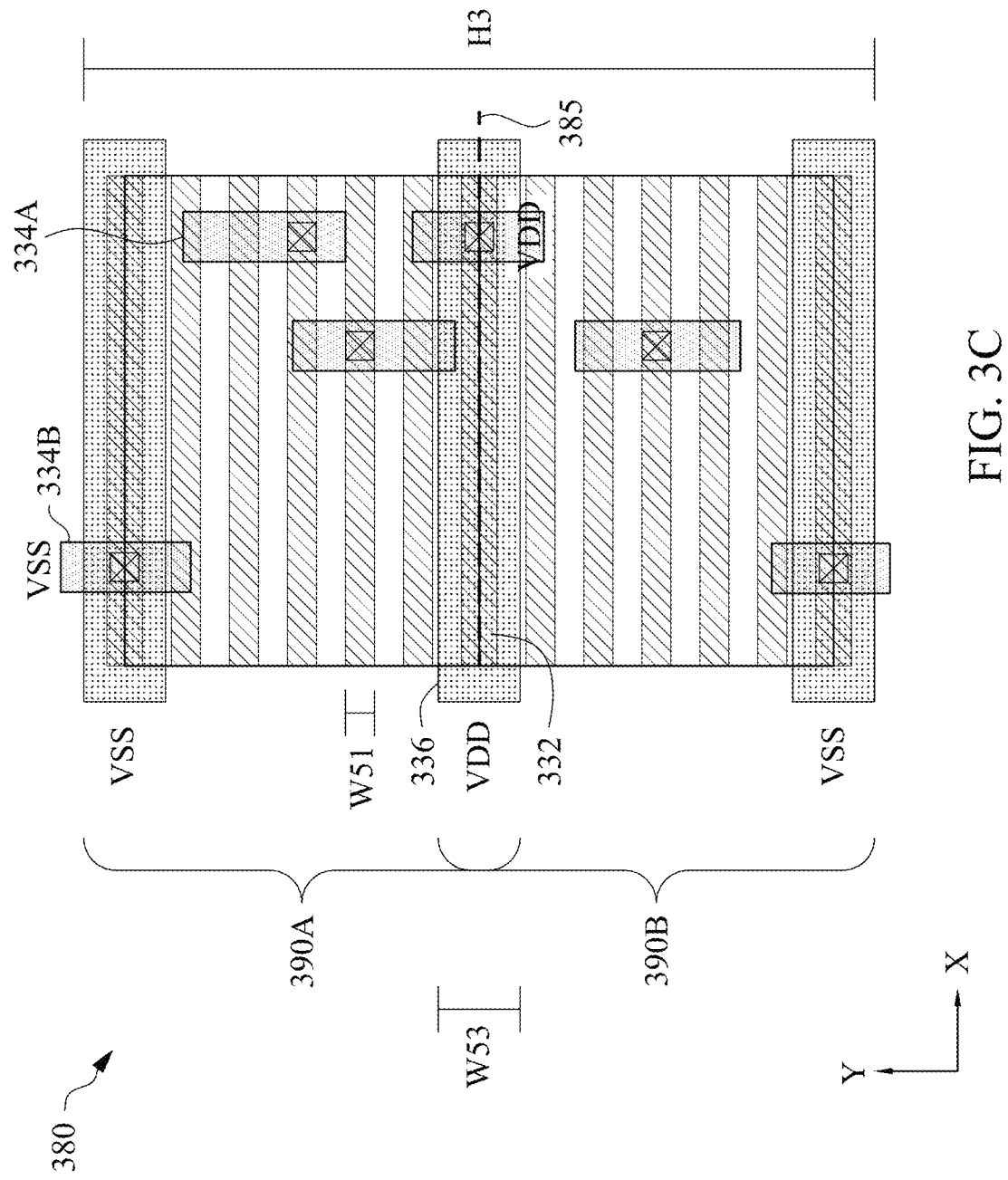
FIG. 3C is a diagram of an example layout design of two standard cells, in accordance with some embodiments.

FIG. 3C is a diagram of an example layout design 380 of two standard cells 390A, 390B, in accordance with some embodiments. The standard cell 390A may be mirrored with respect to an axis 385 to generate the standard cell 390B. In one example, layout patterns for M0 metal rails extend in the X-direction, layout patterns for M1 metal rails extend in the Y-direction, and layout patterns for M2 metal rails extend in the X-direction. M1 metal rail formed according to the layout pattern 334A may be used for connecting or providing a control signal or a logic computation result, where M1 metal rail formed according to the layout pattern 334B may be used for providing power (e.g., VDD or VSS). In one example, the standard cells 390A, 390B may be similar to the standard cells 310A, 310B for FIG. 3A, except that the layout patterns (e.g., layout pattern 336) for the M2 metal rails each have a larger width W53 than the width W51 of the layout patterns (e.g., layout pattern 332) for the M0 metal rails. The standard cells 390A, 390B may also include additional layout patterns for the M2 metal rails having the width W51 or substantially close to the width W51. In one aspect, the standard cells 390A, 390B with the layout patterns (e.g., layout pattern 332) for the M0 metal rails having uniform width W51 and overlapped as shown in FIG. 3C allow two standard cells 390A, 390B to be placed in a compact form with a height H3 that may be the same or close to the height H1 and less than the height H2. Moreover, the standard cells 390A, 390B with the layout patterns (e.g., layout pattern 332) for the M0 metal rails having uniform width W51 and overlapped as shown in FIG. 3C may also allow more number of layout patterns for metal rails (e.g., M0) than in the layout design 350. Meanwhile, the standard cells 390A, 390B with the layout patterns (e.g., layout pattern 336) for the M2 metal rails disposed near top and bottom edges of the standard cells 390A, 390B having a larger width W53 allow resistance of M2 metal rails to be reduced, such that a supply voltage (e.g., VDD, VSS) can be supplied with less degradation due to IR drop.

Figure 4A:
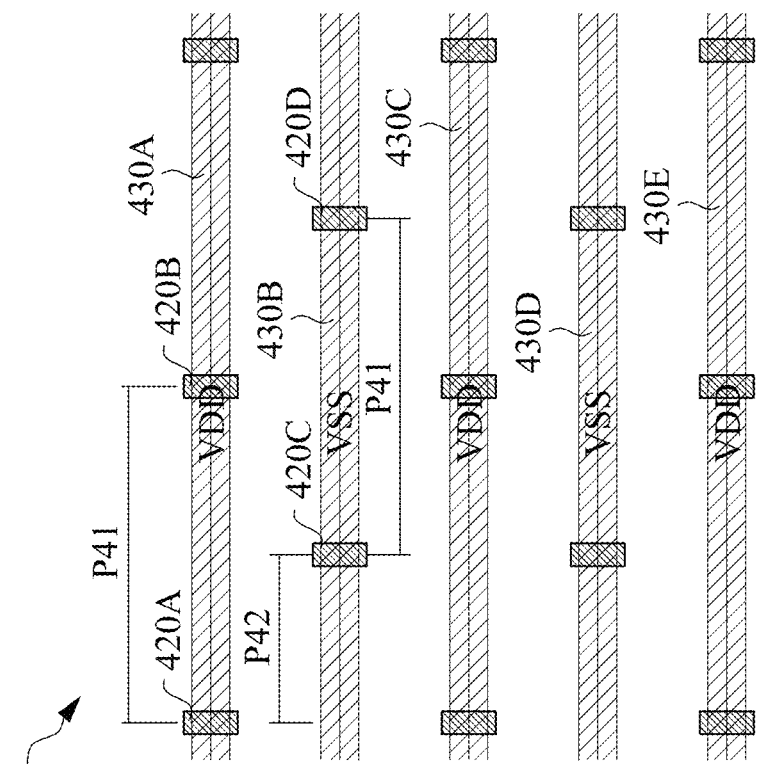
FIG. 4A is a diagram of example layout patterns of metal rails of an integrated circuit, in accordance with some embodiments.
Figure 4B:
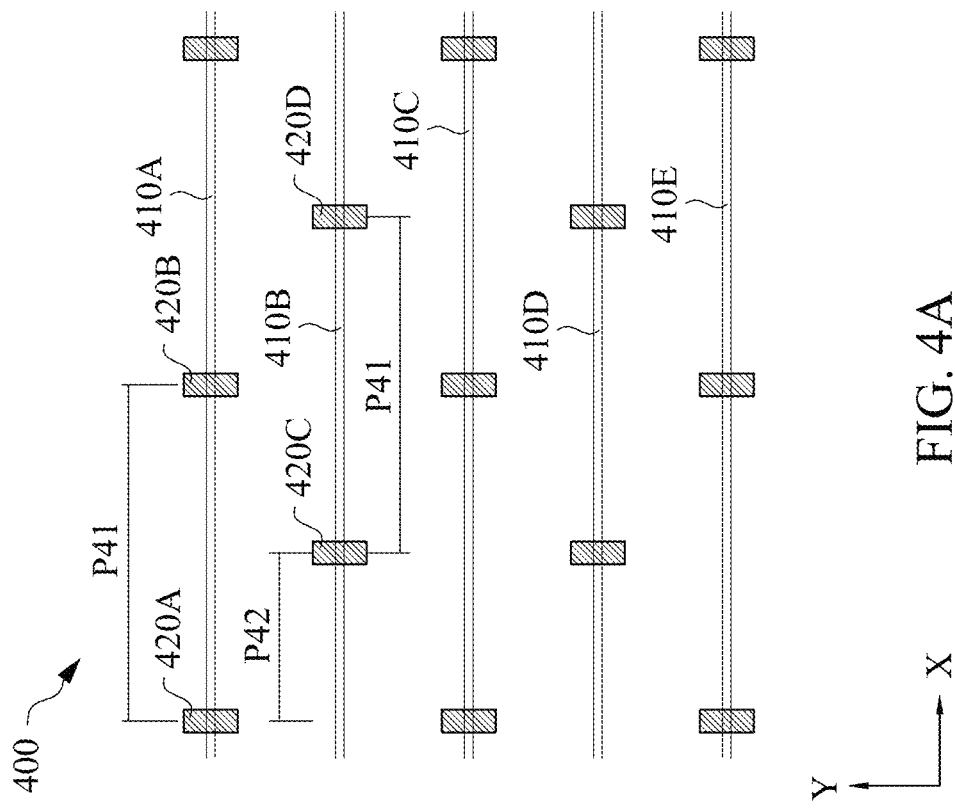
FIG. 4B is a diagram of example layout patterns of metal rails of an integrated circuit, in accordance with some embodiments.

FIGS. 4A and 4B are diagrams of example layout patterns 400, 450 of metal rails of an integrated circuit, in accordance with some embodiments. The layout patterns 400, 450 may extend within a single standard cell or extend across two or more standard cells.

In one aspect, the layout patterns 400 include layout patterns 410A-410E extending in the X-direction and layout patterns 420A-420D extending in the Y-direction. Similarly, the layout patterns 450 include layout patterns 430A-430E extending in the X-direction and the layout patterns 420A-420D extending in the Y-direction. Each of the layout patterns 410A-410E may face a corresponding one of the layout patterns 430A-430E. In one aspect, the layout patterns 410A-410E indicate dimensions and/or locations of metal rails in a M0 layer, the layout patterns 420A-420D indicate dimensions and/or locations of metal rails or metal stubs in a M1 layer, and the layout patterns 430A-430E indicate dimensions and/or locations of metal rails in a M2 layer. Metal rails in the M0 layer may be electrically coupled to the metal rails or metal stubs in the M1 layer through corresponding via contacts C1, and metal rails in the M2 layer may be electrically coupled to the metal rails or metal stubs in the M1 layer through corresponding via contacts C2. Hence, the metal rails in the M2 layer may be electrically coupled to the metal rails in the M0 layer through the metal rails or metal stubs in the M1 layer. By electrically coupling the metal rails in the M2 layer and the metal rails in the M0 layer through multiple metal rails or metal stubs in the M1 layer, a resistance between the metal rails in the M0 layer and the metal rails in the M2 layer can be reduced. In one example, the metal rails formed according to the layout patterns 410A, 410C, 410E, 430A, 430C, 430E are configured as a dual power structure to provide a supply voltage VDD, and the metal rails formed according to the layout patterns 410B, 410D, 430B, 430D are configured as a dual power structure to provide a supply voltage VSS.

In some embodiments, the layout patterns 420A-420D for the metal rails or metal stubs in the M1 layer have a staggered configuration. In one aspect, the layout patterns 420A, 420B intersecting the same layout pattern 410A are separated according to a predetermined pitch P41 along the X-direction. In one aspect, the layout pattern 420A intersecting the layout pattern 410A and the layout pattern 420C intersecting the layout pattern 410B adjacent to the layout pattern 410A are separated according to a predetermined pitch P42 along the X-direction. In one aspect, the layout patterns 420C, 420D intersecting the same layout pattern 410B are separated according to the predetermined pitch P41 along the X-direction. The predetermined pitch P41 may be an even integer (e.g., eight) multiple of a CPP, and the predetermined pitch P42 may be an even integer (e.g., four) multiple of a CPP. The predetermined pitch P42 may be less than the predetermined pitch P41. Hence, the layout patterns 420A-420D can form a staggered structure as shown in FIGS. 4A and 4B. The staggered structure of the metal rails or metal stubs in the M1 layer separated according to integer multiples of the CPP can be implemented to supply power (e.g., VDD, VSS) to multiples (or replicates) of one or more standard cells placed tandem adjacent or partially overlapping with each other.

Figure 4C:
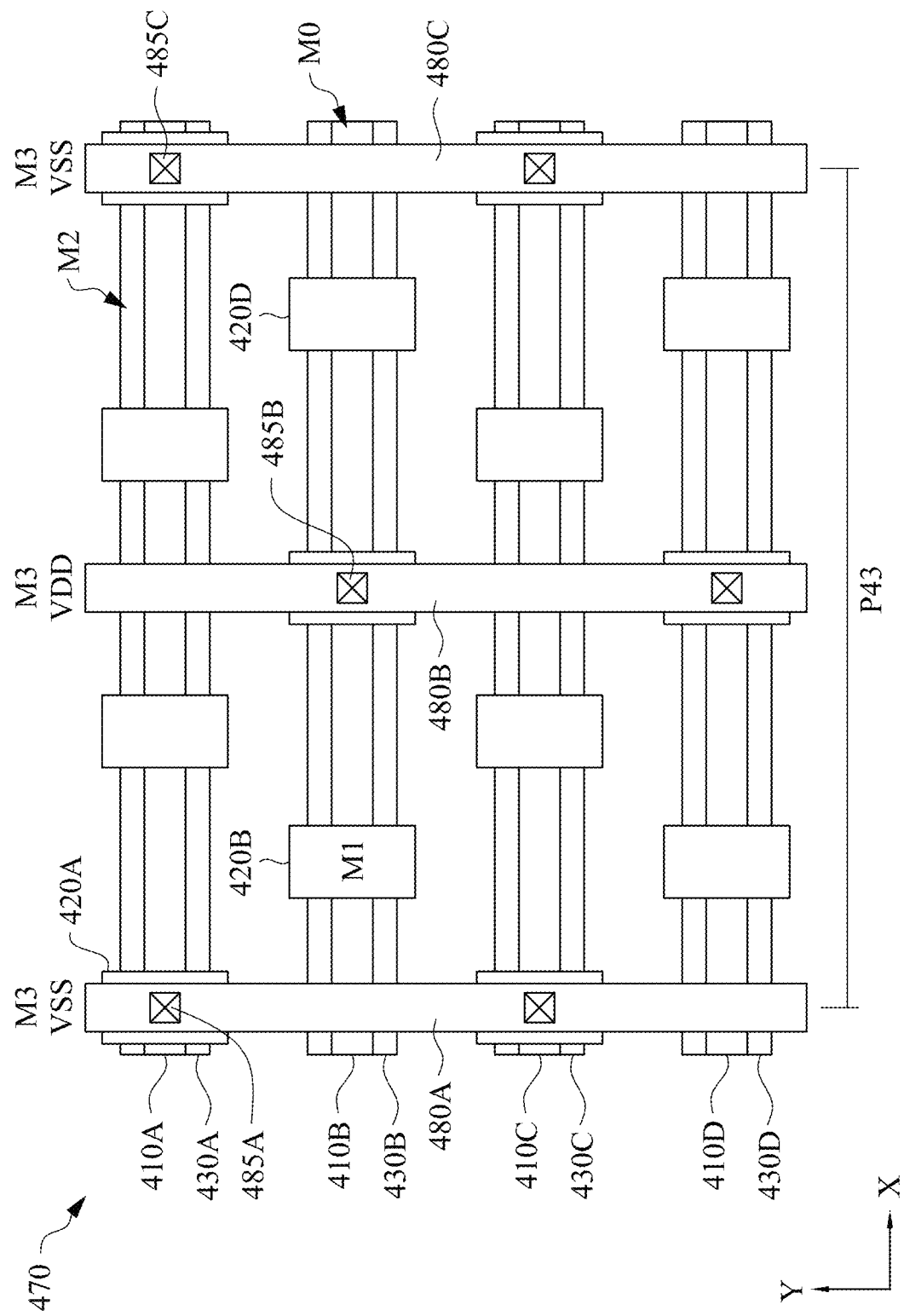
FIG. 4C is a diagram of example layout patterns of metal rails of an integrated circuit, in accordance with some embodiments.
Figure 4D:
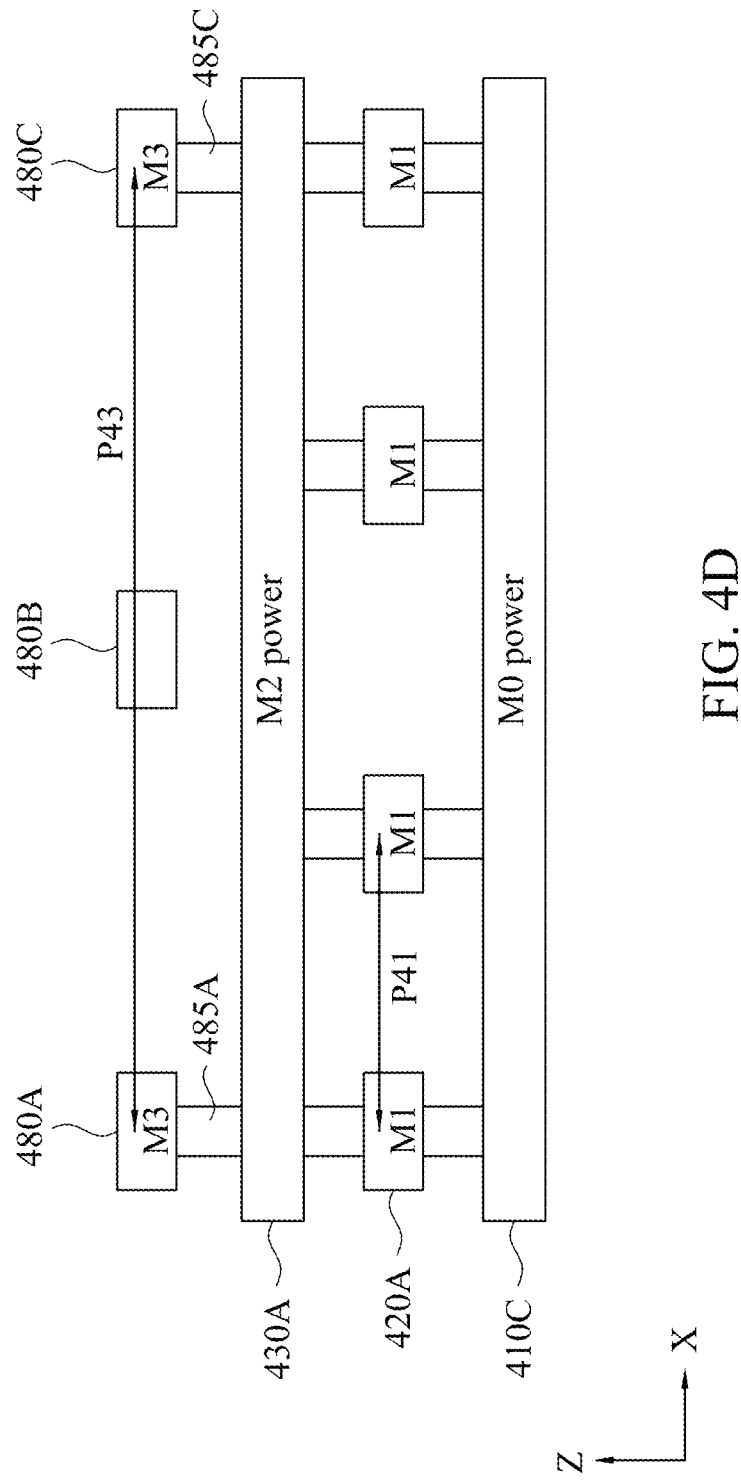
FIG. 4D is a cross section diagram of the metal rails of FIG. 4C, in accordance with some embodiments.

FIG. 4C is a diagram of example layout patterns 470 of metal rails of an integrated circuit, in accordance with some embodiments. FIG. 4D is a cross section diagram of the metal rails formed according to the layout patterns 470 of FIG. 4C, in accordance with some embodiments. In one aspect, the layout patterns 470 correspond to the layout patterns 450 placed over the layout patterns 400 with additional layout patterns for M3 layer and via contacts. For example, the layout patterns 470 include layout patterns 480A, 480B, 480C for M3 layer extending in the Y-direction. For example, the layout patterns 470 also include layout pattern 485A for a via contact between the M2 layer formed according to the layout pattern 430A and M3 layer formed according to the layout pattern 480A. For another example, the layout patterns 470 also include layout pattern 485B for a via contact between the M2 layer formed according to the layout pattern 430B and M3 layer formed according to the layout pattern 480B. For another example, the layout patterns 470 also include layout pattern 485C for a via contact between the M2 layer formed according to the layout pattern 430A and M3 layer formed according to the layout pattern 480C. In this configuration, metal rails formed according to the layout patterns 480A, 480C can be electrically connected with each other and used as a power rail to supply power VSS, and a metal rail formed according to the layout pattern 480B can be used as a power rail to supply power VDD. In one aspect, the layout patterns 480A, 480C for power rails for supplying VSS are separated according to a pitch P43 along the X-direction. The predetermined pitch P43 may be an even integer (e.g., 24) multiple of a CPP. Hence, the M3 metal rails for supplying VSS formed according to the layout patterns 480A, 480C may face M1 metal rails for supplying VSS formed according to the layout patterns (e.g., layout pattern 420A), but the M3 metal rails for supplying VDD formed according to the layout pattern 480B may not face M1 metal rails for supplying VSS. Such regular structure of the layout patterns 470 as shown in FIGS. 4C and 4D allows ease of placement and routing multiple standard cells.

Figure 5:
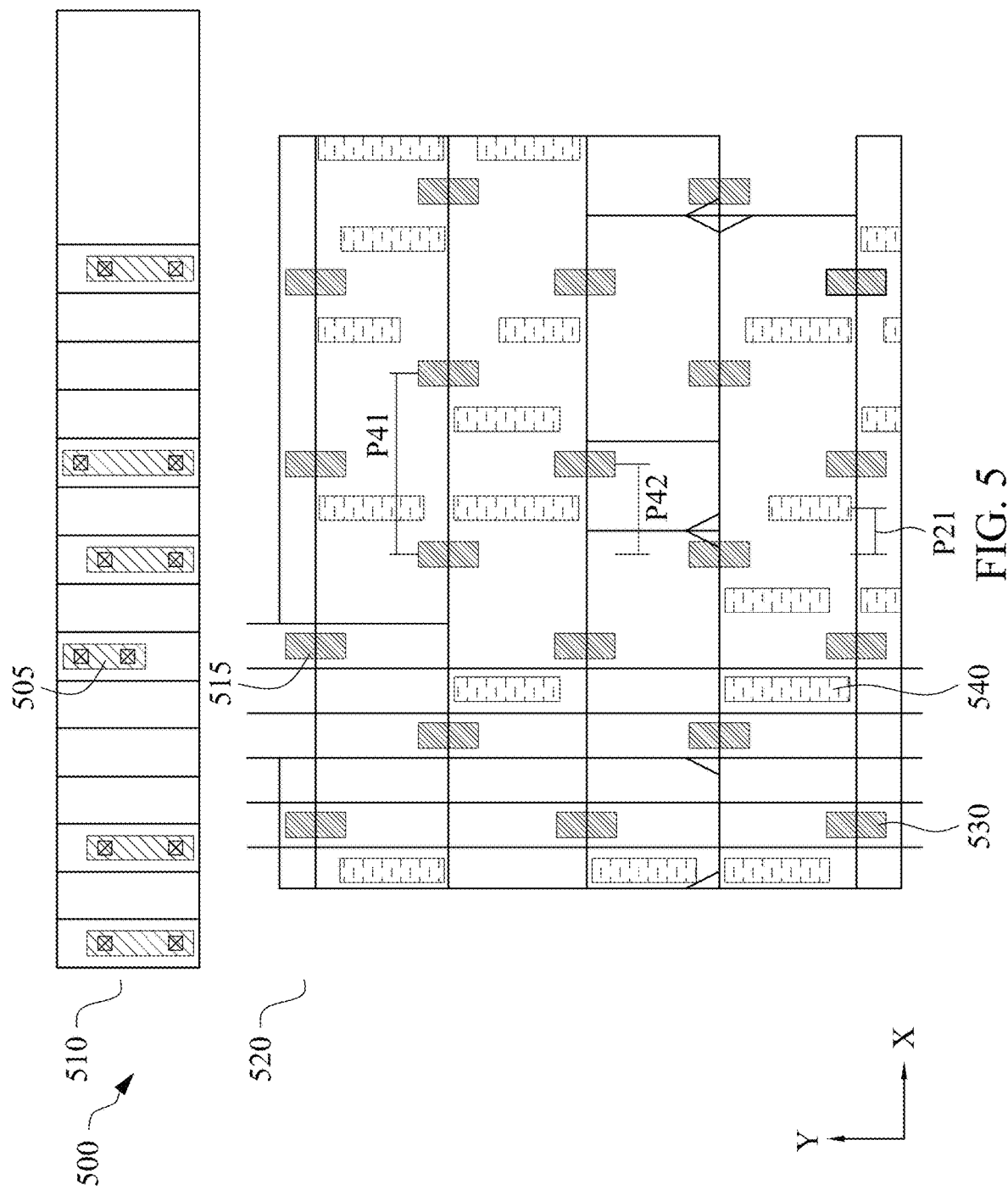
FIG. 5 is a diagram of an example layout pattern of metal rails of an integrated circuit, in accordance with some embodiments.

FIG. 5 is a diagram of an example layout pattern of metal rails of an integrated circuit, in accordance with some embodiments. In FIG. 5, layout designs 510, 520 of different circuits are placed close to each other. Each of the layout designs 510, 520 may include multiples (or replicates) of one or more standard cells tandem adjacent or partially overlapping with each other. In one aspect, the layout designs 510, 520 include layout patterns for metal rails or metal stubs of M1 layer. The layout designs 510, 520 may include additional layout patterns for different metal layers and/or active components (e.g., transistors).

In one aspect, the layout design 510 includes layout patterns for M1 layer separated according to an integer multiples of CPP. For example, layout patterns 530 for metal stubs in M1 layer in the same row along the X-direction are separated according to the pitch P41, which may be an integer multiple (e.g., 4) of CPP. The metal stubs may be implemented to electrically connect between metal rails in the M0 layer and the M2 layer. Similarly, for example, layout patterns 540 for interconnect in M1 layer in the same row along the X-direction are separated according to the pitch P41. The interconnect in the M1 layer can be implemented to electrically connect between metal rails in the M0 layer or between metal rails in the M2 layer. In one aspect, a layout pattern for a metal stub in a row and a layout pattern for another metal stub in an adjacent row are separated according to the pitch P42 along the X-direction, such that layout patterns for the metal stubs can have staggered structure as described above with respect to FIGS. 4A and 4B. In one aspect, layout patterns 530 for metal stubs can be disposed on even tracks, where layout out patterns for interconnect can be disposed on odd tracks.

In one aspect, the layout designs 510, 520 having layout patterns for M1 layer separated according to an integer multiples of CPP as disclosed herein can be easily aligned and routed. For example, the metal rail of M1 layer formed according to a layout pattern 505 in the layout design 510 can be electrically connected to the metal stub of M1 layer formed according to a layout pattern 515 in the layout design 520 through a metal connection in the M1 layer or in a different metal layer (e.g., M3, M5, etc.) extending in the Y-direction. In some embodiments, the layout designs 510, 520 may be automatically aligned, such that a metal connection in the M1 layer or in a different metal layer can be formed to connect between the layout designs 510, 520. In some embodiments, the layout design 510, the layout design 520, or both can be snapped according to one or predetermined tracks separated according to an integer multiple of CPP to assist placement and routing of the layout designs 510, 520.

Figure 6D:
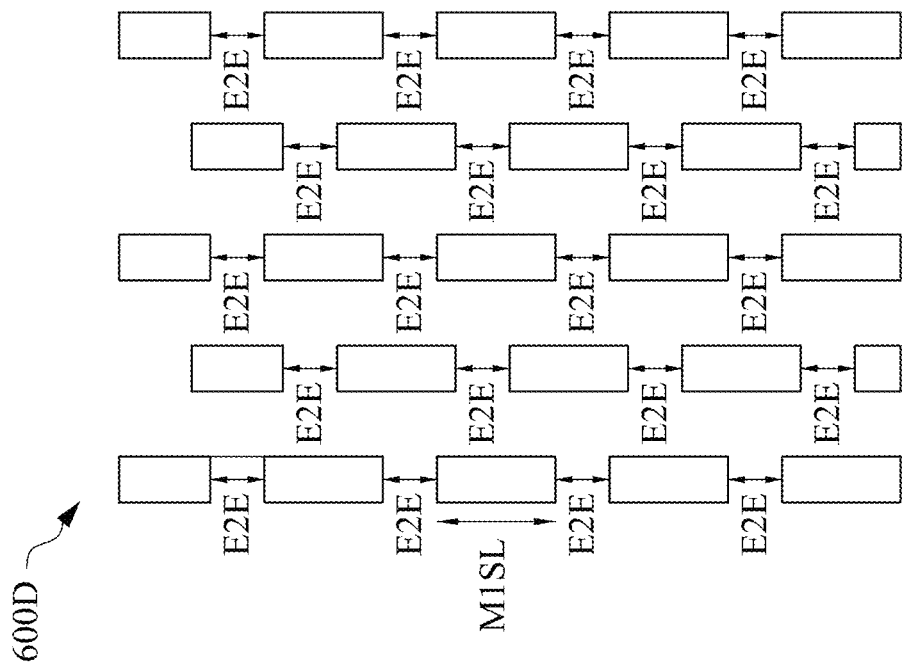
FIG. 6D is a diagram of an example layout pattern of metal rails of an integrated circuit, in accordance with some embodiments.
Figure 6C:
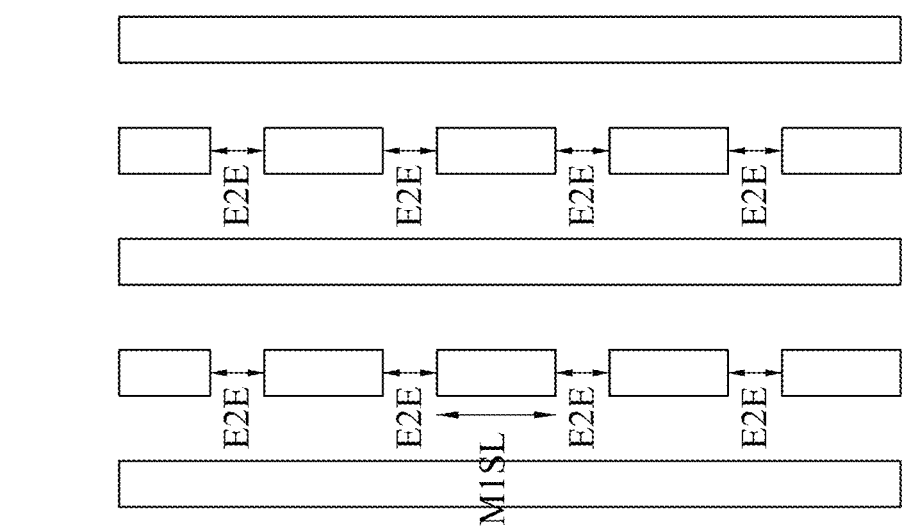
FIG. 6C is a diagram of an example layout pattern of metal rails of an integrated circuit, in accordance with some embodiments.

FIGS. 6A-6D are diagrams of example layout patterns 600A-600D of metal rails of an integrated circuit, in accordance with some embodiments. In one aspect, the layout patterns 600A-600D indicate dimensions and/or locations of metal rails in M1 layer. As shown in FIGS. 6A-6D, the layout patterns 600A-600D of metal rails may extend in the Y-direction. In one aspect, a layout pattern for a metal rail has at least a minimum width M1W allowed for M1 layer and at least a minimum length M1SL. In one example, the minimum length of the layout pattern for the metal rail can be obtained as 0.3–0.5×H, where H is a height of standard cell. A layout pattern for a metal rail may be separated from its adjacent layout pattern for another metal rail by a minimum spacing E2E allowed for M1 layer. In some embodiments, a layout pattern having the minimum length M1SL can be disposed between two layout patterns along the Y-direction. The two layout patterns may have longer lengths than the minimum length M1SL as shown in FIG. 6A, or have the minimum length M1SL as shown in FIGS. 6B-6D. In some embodiments, a layout pattern having the minimum length M1SL can be disposed between two layout patterns along the X-direction. The two layout patterns may have longer lengths than the minimum length M1SL as shown in FIGS. 6A-6D, or have the minimum length M1SL as shown in FIG. 6D. In one aspect, the layout pattern 600D includes layout patterns of metal rails in M1 layer that are staggered as shown in FIG. 6D. Such staggered structured of M1 layer allows ease of placement and routing of components with various configurations. Various layout patterns as shown in FIGS. 6A-6D allow ease of connection between one or more standard cells disclose herein.

Figure 7A:
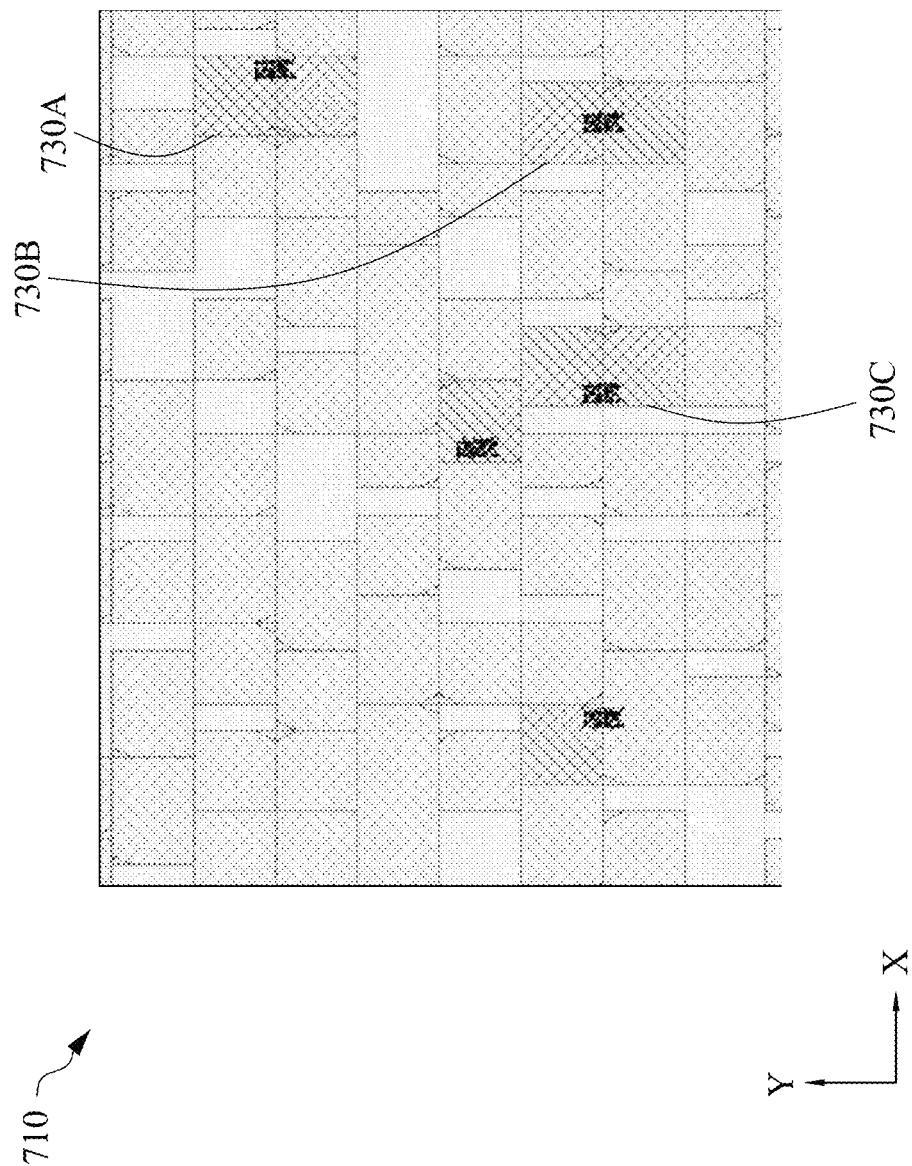
FIG. 7A is a diagram of an example layout pattern of an integrated circuit, in accordance with some embodiments.

FIG. 7A is a diagram of an example set of layout patterns 710. The set of layout patterns 710 may be a part of a complex layout design of an integrated circuit. In one example, different cells including standard cells can be placed and routed during a layout design. In one approach, a design rule check (DRC) can be performed, and one or more portions violating geometric and/or connectivity rules particular to a semiconductor manufacturing process can be identified. For example as shown in FIG. 7A, portions of an integrated circuit violating geometric and/or connectivity rules can be highlighted. Through DRC, types of violations and locations (e.g., Cartesian coordinates) of the violations can be determined. In one example, through DRC, layout patterns 730A, 730B, 730C having similar or same type of violations can be determined.

Figure 7C:
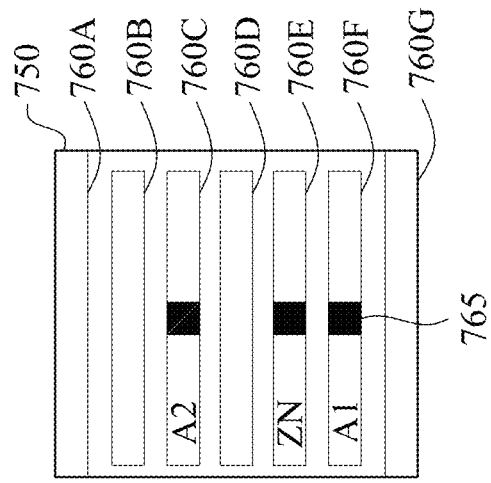
FIG. 7C is a diagram of example layout patterns of contacts and metal rails in a layer of a standard cell, in accordance with some embodiments.
Figure 7B:
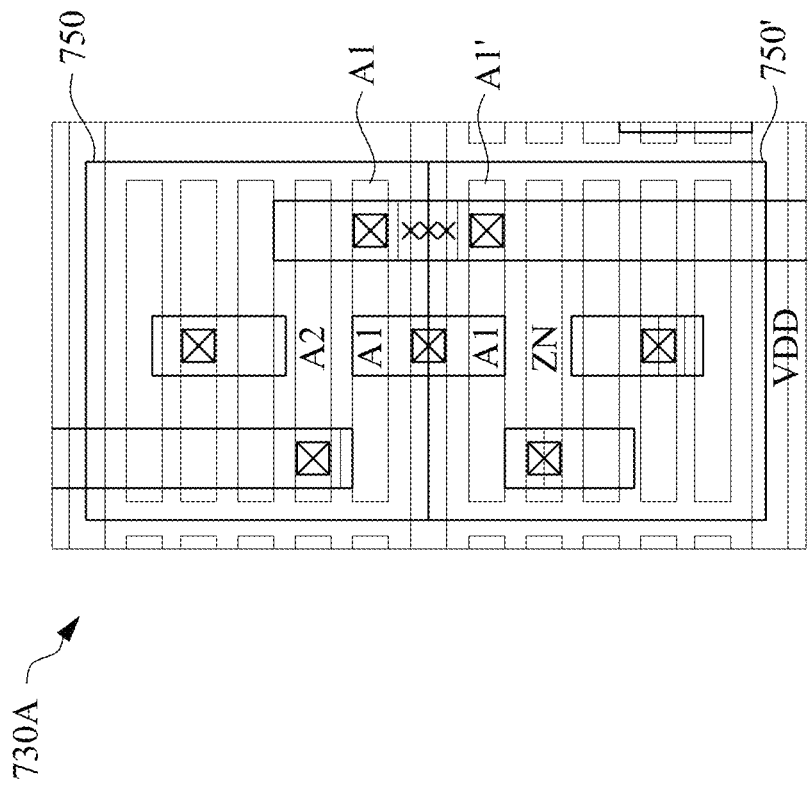
FIG. 7B is a diagram of example layout patterns of a portion of the integrated circuit of FIG. 7A violating a design rule check, in accordance with some embodiments.

Referring to FIG. 7B, illustrated is a diagram of example layout patterns 730A of a portion of the integrated circuit of FIG. 7A violating a rule, in accordance with some embodiments. Referring to FIG. 7C, illustrated is a diagram of example layout patterns 750 of contacts and metal rails in a layer of a standard cell, in accordance with some embodiments. In one example, the set of layout patterns 730A includes a subset of layout patterns 750. The subset of layout patterns 750 may be layout patterns of a standard cell (e.g., the layout design 160 of FIG. 1B). In one example, the subset of layout patterns 750 includes layout patterns 760A-760G for a first metal layer M0 extending in the X-direction. In one example, the layout pattern 760A indicates a dimension and/or a location of a metal rail for supplying power VDD, and the layout pattern 760G indicates a dimension and/or a location of a metal rail for supplying power VSS. In one example, the layout pattern 760C indicates a dimension and/or a location of a metal rail for supplying a signal A2; the layout pattern 760E indicates a dimension and/or a location of a metal rail for supplying a signal Zn; and the layout pattern 760F indicates a dimension and/or a location of a metal rail for supplying a signal A1.

In one example, the layout pattern 730A may not satisfy DRC, because of a layout pattern 765 for a via contact (e.g., VD) overlapping a layout pattern 760F for the metal layer assigned to the signal A1. As described above with respect to FIG. 1B, a metal rail of layout pattern 760F adjacent to the power rail for layout pattern 760G may be forbidden from having a via contact (e.g., VD) with an active region of a transistor, to allow each of the layout patterns 760A-760G to have a uniform width and/or a uniform pitch while reducing an area allocated for the standard cell. For example, the layout patterns for the signals A1 and A1' may violate an end to end spacing rule.

Figure 7E:
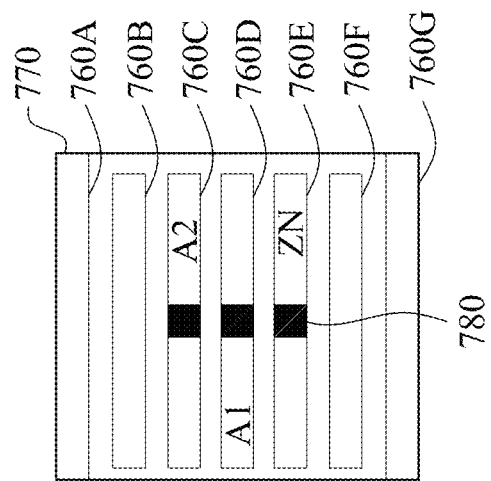
FIG. 7E is a diagram of example layout patterns of contacts and metal rails in a layer of a replacement cell, in accordance with some embodiments.
Figure 7D:
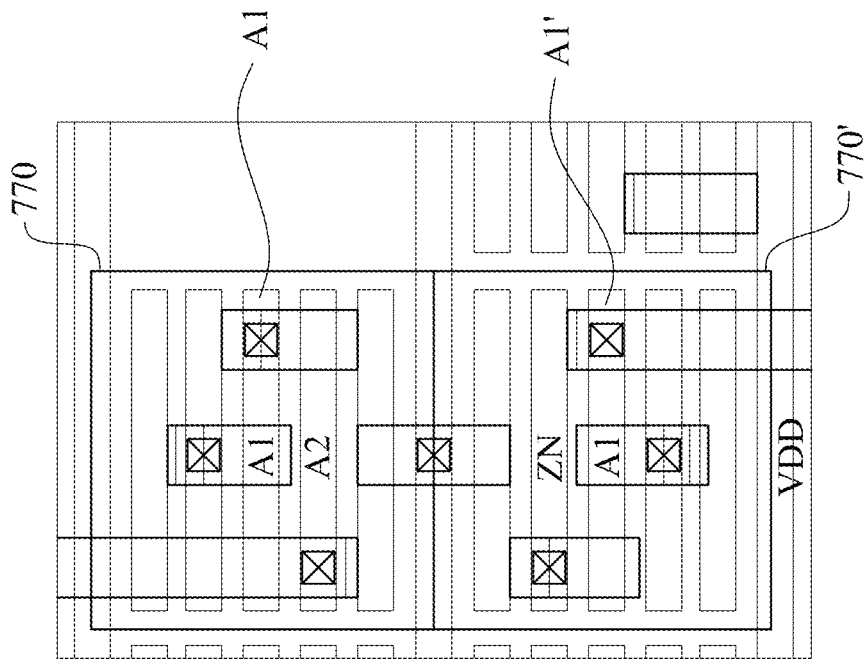
FIG. 7D is a diagram of example layout patterns of a portion of the integrated circuit after replacement, in accordance with some embodiments.

Referring to FIG. 7D, illustrated is a diagram of example layout patterns 765 of a portion of the integrated circuit after replacement, in accordance with some embodiments. Referring to FIG. 7E, illustrated is a diagram of example layout patterns 770 of contacts and metal rails in a layer of a replacement cell, in accordance with some embodiments. In one approach, a portion of the subset of layout patterns 750 not satisfying the DRC is identified, and the set of equivalent layout patterns 770 that is electrically equivalent to the subset of layout patterns 750 is determined. In one aspect, a type of violation and a location of the portion of the layout patterns 750 violating DRC can be determined. According to the determined type and location of violation, electrically equivalent layout patterns 770 of the layout patterns 750 satisfying DRC can be automatically determined as replacement patterns. For example, the set of equivalent layout patterns 770 includes the layout pattern 760D of the metal rail assigned to the signal A1, such that a layout pattern 780 for a via contact (e.g., VD) can be placed away from the layout pattern 760G for the power rail. The subset of layout patterns 750 can be replaced by the set of equivalent layout patterns 770. In one aspect, rather than replacing the entire set of layout patterns 730A, the subset of layout patterns 750 not satisfying a rule for one or more predetermined metal rails in a standard cell can be identified, and the subset of layout patterns 750 can be replaced by the set of equivalent layout patterns 770, such that other layout patterns of the set of layout patterns 730A may not be corrected or recreated. By replacing a subset of layout patterns of a standard cell with replacement patterns, multiple layout patterns 730A, 730B, 730C with similar type of violations can be automatically corrected.

Figure 8:
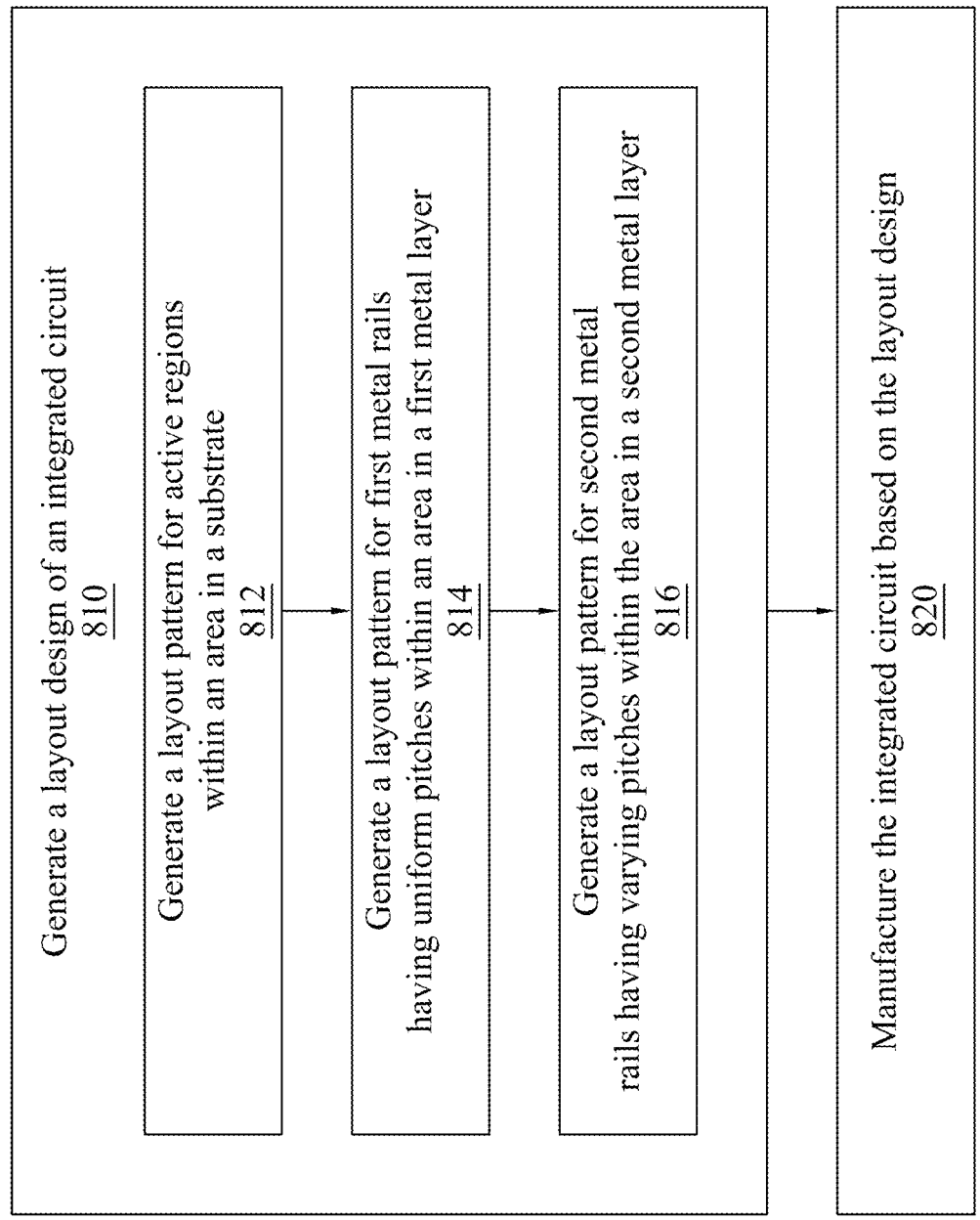
FIG. 8 is a flowchart of a method of manufacturing an integrated circuit, in accordance with some embodiments.

FIG. 8 is a flowchart of a method 800 of forming or manufacturing an integrated circuit in accordance with some embodiments. It is understood that additional operations may be performed before, during, and/or after the method 800 depicted in FIG. 8. In some embodiments, the method 800 is usable to form an integrated circuit according to various layout designs as disclosed herein.

In operation 810 of the method 800, a layout design of an integrated circuit is generated. The operation 810 is performed by a processing device (e.g., processor 1002 (FIG. 10)) configured to execute instructions for generating a layout design. In one approach, the layout design is generated by placing layout designs of one or more standard cells through a user interface. In one approach, the layout design is automatically generated by a processor executing a synthesis tool that converts a logic design (e.g., Verilog) into a corresponding layout design. In some embodiments, the layout design is rendered in a graphic database system (GDSII) file format.

In one approach, the operation 810 includes an operation 812 of generating a layout pattern for active regions in a substrate within an area for a standard cell. In one approach, the operation 810 includes an operation 814 of generating a layout pattern for first metal rails (e.g., in M0 layer) extending in a first direction (e.g., X-direction). Each of the first metal rails may have a uniform pitch and/or a uniform width within an area in a first metal layer. In one approach, the operation 810 includes an operation 816 of generating a layout pattern for second metal rails (e.g., in M2 layer) extending in the first direction (e.g., X-direction). The second metal rails may have varying pitches and/or varying widths within the area in a second metal layer. In some embodiments, the operations 812, 814, 816 are performed by a computing device (e.g., a system 1000 of FIG. 10) operated by a fabrication facility to create a layout design of a standard cell. The layout design can be provided to a computing device operated by a circuit designer as a PDK. In some embodiments, the operations 812, 814, 816 are performed by a computing device (e.g., a system 1000 of FIG. 10) operated by a circuit designer. In one aspect, the layout design of the standard cell having a layout pattern for first metal rails (e.g., in M0 layer) with the uniform pitch and/or uniform width and a layout pattern for second metal rails (e.g., in M2 layer) with the varying pitches and/or varying widths allows the integrated circuit to be implemented in a compact form, while preserving a signal quality or a supply voltage.

In operation 820 of the method 800, the integrated circuit is manufactured based on the layout design. In some embodiments, the operation 820 of the method 800 comprises manufacturing at least one mask based on the layout design, and manufacturing the integrated circuit based on the at least one mask.

Figure 9:
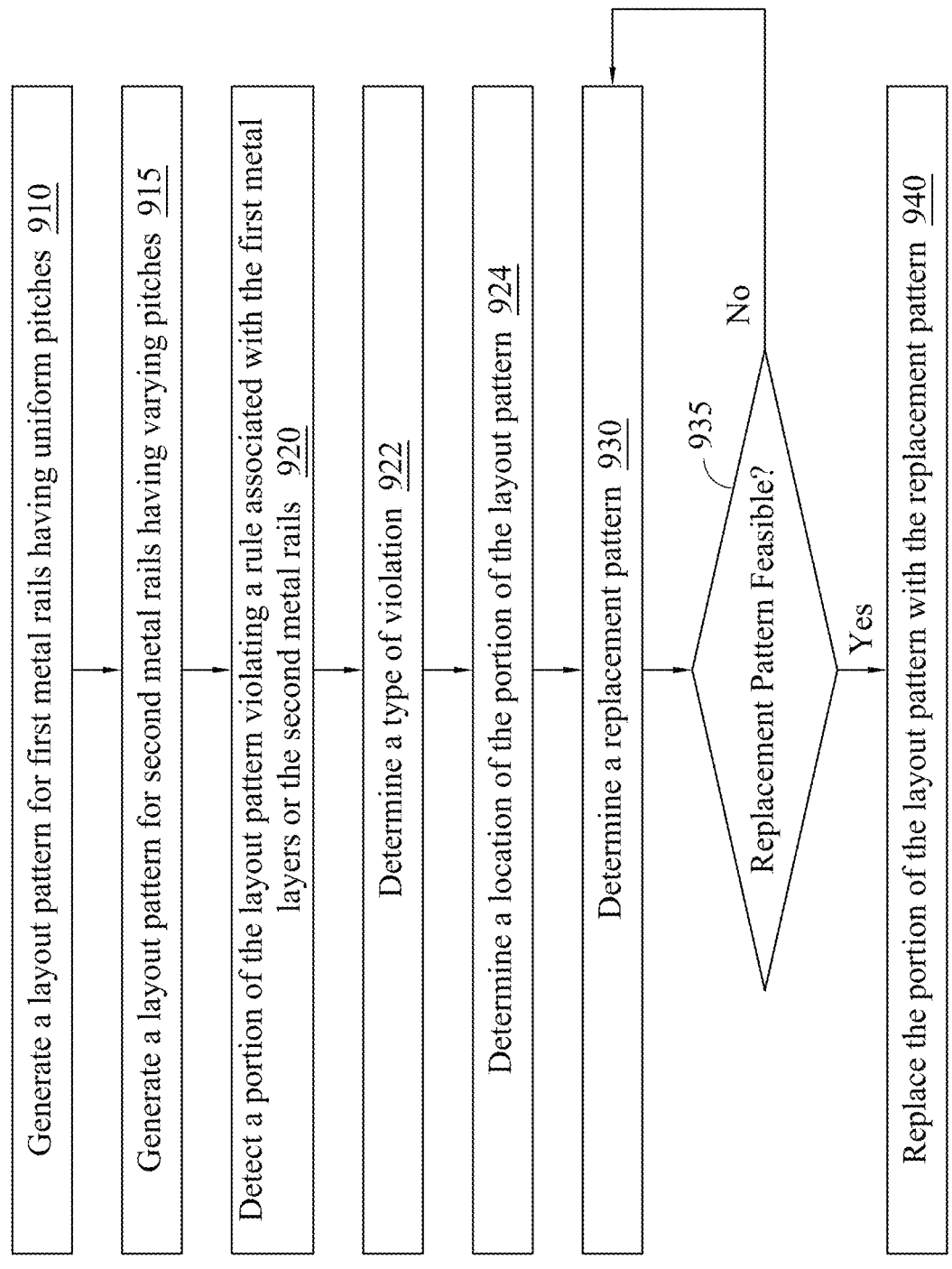
FIG. 9 is a flowchart of a method of replacing a layout pattern of a portion of an integrated circuit with an equivalent layout pattern, in accordance with some embodiments.

FIG. 9 is a flowchart of a method 900 of replacing a layout pattern of a portion of an integrated circuit with an equivalent layout pattern, in accordance with some embodiments. It is understood that additional operations may be performed before, during, and/or after the method 900 depicted in FIG. 9. In some embodiments, the method 900 is usable to form an integrated circuit according to various layout designs as disclosed herein. In some embodiments, the method 900 is automatically performed by a processing device (e.g., processor 1002 (FIG. 10)) configured to execute instructions for generating a layout design. In some embodiments, the method 900 is performed as part of the operation 810 of FIG. 8.

In operation 910 of the method 900, a layout pattern for first metal rails is generated. In one approach, layout patterns (e.g., layout patterns 160 of FIG. 1B) of a standard cell can be placed. The layout patterns may include a layout pattern for first metal rails in a first metal layer (e.g., M0 layer) extending in a first direction (e.g., X-direction) within an area of the standard cell. Each of the first metal rails may have a uniform pitch and/or a uniform width within the area of the standard cell.

In operation 915 of the method 900, a layout pattern for second metal rails is generated. The layout patterns of the standard cell may include a layout pattern for second metal rails in a second metal layer (e.g., M2 layer) extending in the first direction (e.g., X-direction) within the area of the standard cell. The second metal rails may have varying pitches and/or varying widths within the area of the standard cell. After the layout patterns of a standard cell are placed, a user may attempt to place a layout pattern (e.g., layout pattern 765) for a via contact (e.g., VD) below a layout pattern (e.g., layout pattern 760F) for a metal rail of FIG. 7C that is adjacent to a layout pattern (e.g., layout pattern 760G) for a power rail to supply power (e.g., VDD or VSS).

In operation 920 of the method 900, a portion of the layout pattern violating a rule associated with the first metal layers of the standard cell is detected. For example, a DRC can be performed on the layout pattern to automatically detect the portion of the layout pattern violating the rule associated with the first metal layers of the standard cell. An example rule associated with the first metal layer of the standard cell is one or more predetermined metal rails in the first metal layer (e.g., M0 layer) are forbidden from having a via contact (e.g., VD) for electrically coupling to an active area region underneath. For example, a layout pattern 765 for the via contact (e.g., VD) overlapping a layout pattern 760F for a metal rail of FIG. 7C adjacent to a layout pattern 760G for a power rail is forbidden, because of a short distance between the via contact (e.g., VD) and the PTAP of the layout pattern 760G of the power rail. In one approach, in operation 922, a type of violation (e.g., invalid contact location) is determined, in operation 924, a location (e.g., Cartesian coordinate) of the portion of the layout pattern is determined.

In operation 930, a replacement pattern for the portion of the layout pattern is determined, for example, according to the type of violation and the location of the portion of the layout pattern. In one example, the replacement pattern may have a layout pattern 780 for a via contact (e.g., VD) placed away from the layout pattern 760G for the power rail. In one example, a signal can be assigned to a different metal rail to avoid the via contact near the power rail. In one approach, an unassigned metal rail can be identified, and a signal assigned to a metal rail in violation can be reassigned to the unassigned metal rail. In one example, a signal assigned to a metal rail near a boundary or a side of a standard cell can be assigned to a next metal rail away from the boundary or the side of the standard cell. Moreover, a layout pattern for a via contact between a layout pattern for the reassigned metal rail and an active region can be generated.

In operation 935, whether the replacement pattern is feasible or not can be determined. For example in operation 935, whether the replacement pattern satisfies various DRC rules can be determined. In operation 940, the layout pattern or the portion of the layout pattern is replaced by the replacement pattern, in response to the replacement pattern being feasible. In some cases, engineering change order routing may be performed after the replacement. In response to the replacement pattern not being feasible, the method 900 may return to the operation 930, and re-determine or regenerate another replacement pattern. The layout pattern or the portion of the layout pattern may be automatically replaced by the replacement pattern, such that a user may not have to manually identify a portion of the layout pattern violating DRC, and fix the layout design. In some embodiments, multiple replacement patterns can be generated, and a replacement pattern with a least amount of changes from the portion of the layout pattern can be selected and used. With more than billions of components in an integrated circuit, such automatic correction of routing of the standard cells can improve the speed and efficiency of generating a layout design of the complex integrated circuit.

Figure 10:
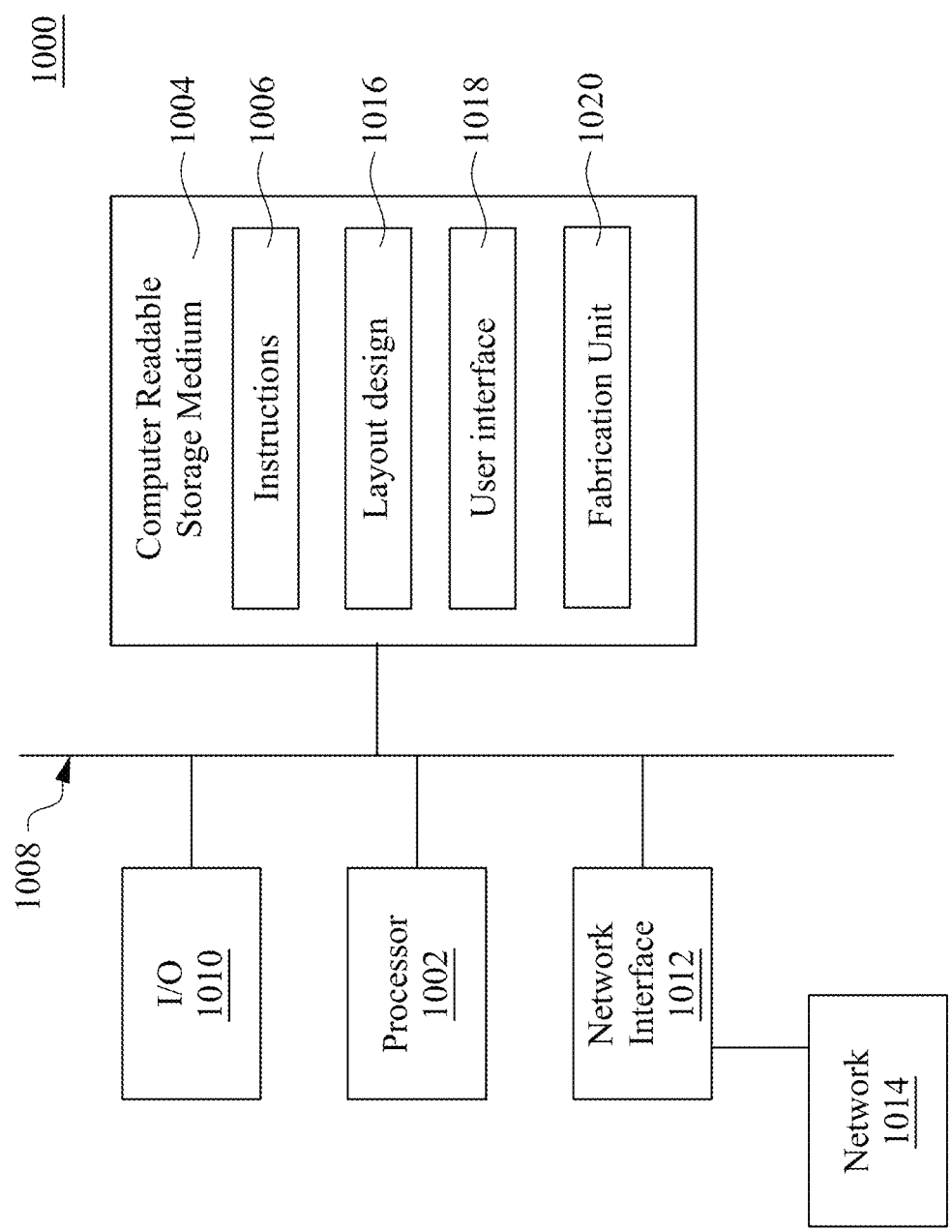
FIG. 10 is a block diagram of a system of generating an IC layout design, in accordance with some embodiments.

FIG. 10 is a schematic view of a system 1000 for designing and manufacturing an IC layout design in accordance with some embodiments. In some embodiments, system 1000 generates or places one or more IC layout designs described herein. In some embodiments, the system 1000 manufactures one or more ICs based on the one or more IC layout designs described herein. The system 1000 includes a hardware processor 1002 and a non-transitory, computer readable storage medium 1004 encoded with, e.g., storing, the computer program code 1006, e.g., a set of executable instructions. Computer readable storage medium 1004 is configured for interfacing with manufacturing machines for producing the integrated circuit. The processor 1002 is electrically coupled to the computer readable storage medium 1004 by a bus 1008. The processor 1002 is also electrically coupled to an I/O interface 1010 by bus 1008. A network interface 1012 is also electrically connected to the processor 1002 by bus 1008. Network interface 1012 is connected to a network 1014, so that processor 1002 and computer readable storage medium 1004 are capable of connecting to external elements via network 1014. The processor 1002 is configured to execute the computer program code 1006 encoded in the computer readable storage medium 1004 in order to cause system 1000 to be usable for performing a portion or all of the operations as described in method 800 or 900.

In some embodiments, the processor 1002 is a central processing unit (CPU), a multi-processor, a distributed processing system, an application specific integrated circuit (ASIC), and/or a suitable processing unit.

In some embodiments, the computer readable storage medium 1004 is an electronic, magnetic, optical, electromagnetic, infrared, and/or a semiconductor system (or apparatus or device). For example, the computer readable storage medium 1004 includes a semiconductor or solid-state memory, a magnetic tape, a removable computer diskette, a random access memory (RAM), a read-only memory (ROM), a rigid magnetic disk, and/or an optical disk. In some embodiments using optical disks, the computer readable storage medium 1004 includes a compact disk-read only memory (CD-ROM), a compact disk-read/write (CD-R/W), and/or a digital video disc (DVD).

In some embodiments, the storage medium 1004 stores the computer program code 1006 configured to cause system 1000 to perform method 800 or 900. In some embodiments, the storage medium 1004 also stores information needed for performing method 800 or 900 as well as information generated during performance of method 800 or 900, such as layout design 1016 and user interface 1018 and fabrication unit 1020, and/or a set of executable instructions to perform the operation of method 800 or 900. In some embodiments, layout design 1016 comprises one or more layout patterns for the layout design 160.

In some embodiments, the storage medium 1004 stores instructions (e.g., computer program code 1006) for interfacing with manufacturing machines. The instructions (e.g., computer program code 1006) enable processor 1002 to generate manufacturing instructions readable by the manufacturing machines to effectively implement method 800 or 900 during a manufacturing process.

System 1000 includes I/O interface 1010. I/O interface 1010 is coupled to external circuitry. In some embodiments, I/O interface 1010 includes a keyboard, keypad, mouse, trackball, trackpad, and/or cursor direction keys for communicating information and commands to processor 1002.

System 1000 also includes network interface 1012 coupled to the processor 1002. Network interface 1012 allows system 1000 to communicate with network 1014, to which one or more other computer systems are connected. Network interface 1012 includes wireless network interfaces such as BLUETOOTH, WIFI, WIMAX, GPRS, or WCDMA; or wired network interface such as ETHERNET, USB, or IEEE-13154. In some embodiments, method 800 or 900 is implemented in two or more systems 1000, and information such as layout design, user interface and fabrication unit are exchanged between different systems 1000 by network 1014.

System 1000 is configured to receive information related to a layout design through I/O interface 1010 or network interface 1012. The information is transferred to processor 1002 by bus 1008 to determine a layout design for producing an IC. The layout design is then stored in computer readable medium 1004 as layout design 1016. System 1000 is configured to receive information related to a user interface through I/O interface 1010 or network interface 1012. The information is stored in computer readable medium 1004 as user interface 1018. System 1000 is configured to receive information related to a fabrication unit through I/O interface 1010 or network interface 1012. The information is stored in computer readable medium 1004 as fabrication unit 1020. In some embodiments, the fabrication unit 1020 includes fabrication information utilized by system 1000.

In some embodiments, method 800 or 900 is implemented as a standalone software application for execution by a processor. In some embodiments, method 800 or 900 is implemented as a software application that is a part of an additional software application. In some embodiments, method 800 or 900 is implemented as a plug-in to a software application. In some embodiments, method 800 or 900 is implemented as a software application that is a portion of an EDA tool. In some embodiments, method 800 or 900 is implemented as a software application that is used by an EDA tool. In some embodiments, the EDA tool is used to generate a layout design of the integrated circuit device. In some embodiments, the layout design is stored on a non-transitory computer readable medium. In some embodiments, the layout design is generated using a tool such as VIRTUOSO® available from CADENCE DESIGN SYSTEMS, Inc., or another suitable layout generating tool. In some embodiments, the layout design is generated based on a netlist which is created based on the schematic design. In some embodiments, method 800 or 900 is implemented by a manufacturing device to manufacture an integrated circuit using a set of masks manufactured based on one or more layout designs generated by system 1000. In some embodiments, system 1000 is a manufacturing device to manufacture an integrated circuit using a set of masks manufactured based on one or more layout designs of the present disclosure. In some embodiments, system 1000 of FIG. 10 generates layout designs of an IC that are smaller than other approaches. In some embodiments, system 1000 of FIG. 10 generates layout designs of an IC that occupy less area than other approaches.

Figure 11:
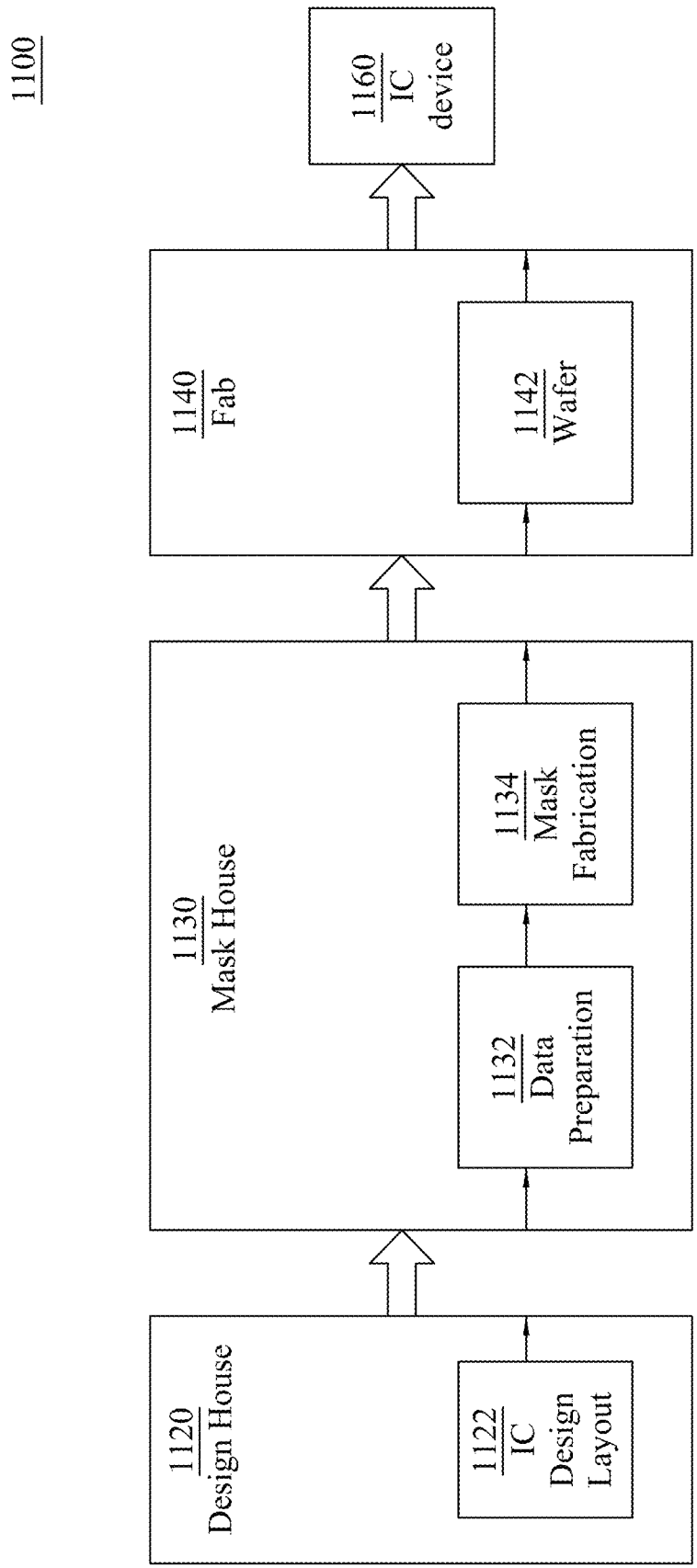
FIG. 11 is a block diagram of an IC manufacturing system, and an IC manufacturing flow associated therewith, in accordance with at least one embodiment of the present disclosure.

FIG. 11 is a block diagram of an integrated circuit (IC) manufacturing system 1100, and an IC manufacturing flow associated therewith, in accordance with at least one embodiment of the present disclosure.

In FIG. 11, IC manufacturing system 1100 includes entities, such as a design house 1120, a mask house 1130, and an IC manufacturer/fabricator ("fab") 1140, that interact with one another in the design, development, and manufacturing cycles and/or services related to manufacturing an IC device 1160. The entities in system 1100 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 1120, mask house 1130, and IC fab 1140 is owned by a single larger company. In some embodiments, two or more of design house 1120, mask house 1130, and IC fab 1140 coexist in a common facility and use common resources.

Design house (or design team) 1120 generates an IC design layout 1122. IC design layout 1122 includes various geometrical patterns designed for an IC device 1160. The geometrical patterns correspond to patterns of metal, oxide, or semiconductor layers that make up the various components of IC device 1160 to be fabricated. The various layers combine to form various IC features. For example, a portion of IC design layout 1122 includes various IC features, such as an active region, gate electrode, source electrode and drain electrode, metal lines or via contacts of an interlayer interconnection, and openings for bonding pads, to be formed in a semiconductor substrate (such as a silicon wafer) and various material layers disposed on the semiconductor substrate. Design house 1120 implements a proper design procedure to form IC design layout 1122. The design procedure includes one or more of logic design, physical design or place and route. IC design layout 1122 is presented in one or more data files having information of the geometrical patterns. For example, IC design layout 1122 can be expressed in a GDSII file format or DFII file format.

Mask house 1130 includes mask data preparation 1132 and mask fabrication 1134. Mask house 1130 uses IC design layout 1122 to manufacture one or more masks to be used for fabricating the various layers of IC device 1160 according to IC design layout 1122. Mask house 1130 performs mask data preparation 1132, where IC design layout 1122 is translated into a representative data file ("RDF"). Mask data preparation 1132 provides the RDF to mask fabrication 1134. Mask fabrication 1134 includes a mask writer. A mask writer converts the RDF to an image on a substrate, such as a mask (reticle) or a semiconductor wafer. The design layout is manipulated by mask data preparation 1132 to comply with particular characteristics of the mask writer and/or requirements of IC fab 1140. In FIG. 11, mask data preparation 1132 and mask fabrication 1134 are illustrated as separate elements. In some embodiments, mask data preparation 1132 and mask fabrication 1134 can be collectively referred to as mask data preparation.

In some embodiments, mask data preparation 1132 includes optical proximity correction (OPC) which uses lithography enhancement techniques to compensate for image errors, such as those that can arise from diffraction, interference, other process effects and the like. OPC adjusts IC design layout 1122. In some embodiments, mask data preparation 1132 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 1132 includes a mask rule checker (MRC) that checks the IC design layout that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout to compensate for limitations during mask fabrication 1134, which may undo part of the modifications performed by OPC in order to meet mask creation rules.

In some embodiments, mask data preparation 1132 includes lithography process checking (LPC) that simulates processing that will be implemented by IC fab 1140 to fabricate IC device 1160. LPC simulates this processing based on IC design layout 1122 to create a simulated manufactured device, such as IC device 1160. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC can be repeated to further refine IC design layout 1122.

It should be understood that the above description of mask data preparation 1132 has been simplified for the purposes of clarity. In some embodiments, mask data preparation 1132 includes additional features such as a logic operation (LOP) to modify the IC design layout according to manufacturing rules. Additionally, the processes applied to IC design layout 1122 during mask data preparation 1132 may be executed in a variety of different orders.

After mask data preparation 1132 and during mask fabrication 1134, a mask or a group of masks are fabricated based on the modified IC design layout. In some embodiments, an electron-beam (e-beam) or a mechanism of multiple e-beams is used to form a pattern on a mask (photomask or reticle) based on the modified IC design layout. The mask can be formed in various technologies. In some embodiments, the mask is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask includes a transparent substrate (e.g., fused quartz) and an opaque material (e.g., chromium) coated in the opaque regions of the mask. In another example, the mask is formed using a phase shift technology. In the phase shift mask (PSM), various features in the pattern formed on the mask are configured to have proper phase difference to enhance the resolution and imaging quality. In various examples, the phase shift mask can be attenuated PSM or alternating PSM. The mask(s) generated by mask fabrication 1134 is used in a variety of processes. For example, such a mask(s) is used in an ion implantation process to form various doped regions in the semiconductor wafer, in an etching process to form various etching regions in the semiconductor wafer, and/or in other suitable processes.

IC fab 1140 is an IC fabrication entity that includes one or more manufacturing facilities for the fabrication of a variety of different IC products. In some embodiments, IC fab 1140 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry entity.

IC fab 1140 uses the mask (or masks) fabricated by mask house 1130 to fabricate IC device 1160. Thus, IC fab 1140 at least indirectly uses IC design layout 1122 to fabricate IC device 1160. In some embodiments, a semiconductor wafer 1142 is fabricated by IC fab 1140 using the mask (or masks) to form IC device 1160. Semiconductor wafer 1142 includes a silicon substrate or other proper substrate having material layers formed thereon. Semiconductor wafer further includes one or more of various doped regions, dielectric features, multilevel interconnects, and the like (formed at subsequent manufacturing steps).

System 1100 is shown as having design house 1120, mask house 1130 or IC fab 1140 as separate components or entities. However, it is understood that one or more of design house 1120, mask house 1130 or IC fab 1140 are part of the same component or entity.

Details regarding an integrated circuit (IC) manufacturing system (e.g., system 1100 of FIG. 11), and an IC manufacturing flow associated therewith are found, e.g., in U.S. Pat. No. 9,256,709, granted Feb. 9, 2016, U.S. Patent Application Publication No. 20150278429, published Oct. 1, 2015, U.S. Patent Application Publication No. 20100040838, published Feb. 6, 2014, and U.S. Pat. No. 7,260,442, granted Aug. 21, 2007, the entireties of each of which are hereby incorporated by reference.

One aspect of this description relates to an integrated circuit. In some embodiments, the integrated circuit includes a substrate, a first layer facing the substrate, and the second layer facing the first layer. The second layer may be farther from the substrate than the first layer. In some embodiments, the first layer includes a set of first metal rails within an area of the integrated circuit, where each of the set of first metal rails is separated from its adjacent one of the set of first metal rails according to a uniform pitch along a direction. In some embodiments, the second layer includes a set of second metal rails within the area, where the set of second metal rails includes two adjacent second metal rails separated according to a first pitch along the direction and additional two adjacent second metal rails separated according to a second pitch along the direction.

One aspect of this description relates to an integrated circuit. In some embodiments, the integrated circuit includes a substrate, a first layer facing the substrate, and a second layer facing the first layer. In some embodiments, the first layer includes a set of first metal rails extending in a first direction within an area of the integrated circuit, where each of the set of first metal rails has a first width along a second direction traversing the first direction. In some embodiments, the second layer includes a set of second metal rails extending in the first direction within the area of the integrated circuit. In some embodiments, the set of second metal rails includes two second metal rails and an additional second metal rail between the two second metal rails, where each of the two second metal rails has a second width along the second direction, and the additional second metal rail has a third width along the second direction.

One aspect of this description related to generating a layout design of an integrated circuit. In some embodiments, the method includes generating, by a processor, a layout pattern for a first layer facing a substrate of the integrated circuit. The first layer may include first metal rails with a uniform pitch within an area of the integrated circuit. In some embodiments, the method includes generating, by the processor, a layout pattern for a second layer of the integrated circuit facing the first layer. The second layer may include second metal rails with varying pitches within the area of the integrated circuit. In some embodiments, the method includes detecting, by the processor, a portion of the layout pattern for the area of the integrated circuit violating a placement rule associated with the first metal rails. In some embodiments, the method includes determining, by the processor, a replacement pattern for the portion of the layout pattern. In some embodiments, the method includes replacing, by the processor, the portion of the layout pattern with the determined replacement pattern.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit comprising:
   a substrate;
   a first layer facing the substrate, the first layer including a set of first metal rails within an area of the integrated circuit, each of the first metal rails separated from its adjacent one of the first metal rails according to a uniform pitch along a direction; and
   a second layer facing the first layer, the second layer farther away from the substrate than the first layer, the second layer including a set of second metal rails within the area, the set of second metal rails including two adjacent second metal rails separated according to a first pitch along the direction and additional two adjacent second metal rails separated according to a second pitch different from the first pitch along the direction.

2. The integrated circuit of claim 1, wherein each of the set of first metal rails has a uniform width along the direction.

3. The integrated circuit of claim 1, wherein a second metal rail of the set of second metal rails has a first width along the direction, wherein another second metal rail of the set of second metal rails has a second width along the direction.

4. The integrated circuit of claim 1, wherein the set of second metal rails includes two second metal rails and one or more second metal rails disposed between the two second metal rails, each of the two second metal rails having a first width along the direction, each of the one or more second metal rails having a second width along the direction, the second width less than the first width.

5. The integrated circuit of claim 4, wherein each of the two second metal rails of the set of second metal rails faces a corresponding one of two first metal rails of the set of first metal rails, each of the two first metal rails having a third width along the direction, the third width less than the first width.

6. The integrated circuit of claim 1, wherein the set of first metal rails includes:
   a first metal rail, and
   an adjacent first metal rail adjacent to the first metal rail, a distance between i) a side of the first metal rail away from the adjacent first metal rail and ii) a side of the adjacent first metal rail towards the first metal rail along the direction is the uniform pitch.

7. The integrated circuit of claim 1, wherein a portion of a first metal rail of the set of first metal rails extends over an active region of the substrate in another direction, the portion of the first metal rail facing the active region without a contact between the portion of the first metal rail and the active region of the substrate.

8. The integrated circuit of claim 1, further comprising:
   a third layer disposed between the first layer and the second layer, the third layer including a set of third metal rails within the area of the integrated circuit, the set of third metal rails extending in the direction.

9. The integrated circuit of claim 8, wherein the set of first metal rails and the set of second metal rails extend in another direction traversing the direction.

10. The integrated circuit of claim 9, wherein the set of third metal rails includes two adjacent third metal rails separated, along the another direction, by a pitch of a polysilicon in the substrate.

11. The integrated circuit of claim 1, further comprising:
    a third layer disposed between the first layer and the second layer, the third layer including a first metal stub and a second metal stub to electrically couple one of the first metal rails to a corresponding one of the second metal rails, the first metal stub and the second metal stub separated, along another direction traversing the direction, by an even integer multiple of a pitch of a polysilicon in the substrate.

12. The integrated circuit of claim 11, wherein the third layer includes:
    a third metal stub within the area of the integrated circuit to electrically couple another one of the first metal rails to another corresponding one of the second metal rails, the first metal stub and the third metal stub separated, along the another direction traversing the direction, by another even integer multiple of the pitch of the polysilicon in the substrate, the another even integer less than the even integer.

13. The integrated circuit of claim 1, wherein the first layer is a MO layer.

14. The integrated circuit of claim 1, wherein another area of the integrated circuit includes an identical configuration of the area of the integrated circuit.

15. An integrated circuit comprising:
    a substrate;
    a first layer facing the substrate, the first layer including a set of first metal rails extending in a first direction within an area of the integrated circuit, each of the first metal rails having a first width along a second direction traversing the first direction; and
    a second layer facing the first layer, the second layer farther away from the substrate than the first layer, the second layer including a set of second metal rails extending in the first direction within the area of the integrated circuit, the set of second metal rails including two second metal rails and an additional second metal rail between the two second metal rails, each of the two second metal rails having a second width along the second direction, the additional second metal rail having a third width different from the second width along the second direction.

16. The integrated circuit of claim 15, wherein the third width is less than the second width, and wherein the first width is less than the second width.

17. The integrated circuit of claim 15, wherein each of the first metal rails is separated from its adjacent one of the first metal rails by a uniform distance along the second direction.

18. The integrated circuit of claim 15, wherein each of the two second metal rails of the set of second metal rails faces a corresponding one of two first metal rails of the set of first metal rails.

19. The integrated circuit of claim 15, wherein another area of the integrated circuit includes an identical configuration of the area of the integrated circuit.

20. An integrated circuit comprising:
a substrate;
a first layer facing the substrate, the first layer including a set of first metal rails within an area of the integrated circuit, each of the first metal rails separated from its adjacent one of the first metal rails according to a uniform pitch along a direction and having a first width along the direction; and
a second layer facing the first layer, the second layer farther away from the substrate than the first layer, the second layer including a set of second metal rails within the area, the set of second metal rails including two second metal rails and one or more additional second metal rail between the two second metal rails, each of the two second metal rails having a second width greater than the first width along the direction, the one or more additional second metal rails having a third width along the second direction, the one or more additional second metal rails separated with each other with a first pitch, each of the two second metal rails separated from one of the one or more additional second metal rails with a second pitch greater than the first pitch.

* * * * *